United States Patent
Close et al.

(10) Patent No.: US 12,405,322 B2
(45) Date of Patent: Sep. 2, 2025

(54) MAGNETIC POSITION SENSOR SYSTEM AND METHOD

(71) Applicant: Melexis Technologies SA, Bevaix (CH)

(72) Inventors: Gael Close, Morges (CH); Samuel Huber Lindenberger, Jenaz (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 27 days.

(21) Appl. No.: 18/304,570

(22) Filed: Apr. 21, 2023

(65) Prior Publication Data

US 2023/0251332 A1     Aug. 10, 2023

Related U.S. Application Data

(63) Continuation of application No. 17/122,163, filed on Dec. 15, 2020, now Pat. No. 11,668,770.

(30) Foreign Application Priority Data

Dec. 30, 2019    (EP) .................................... 19220092

(51) Int. Cl.
*G01R 33/038* (2006.01)
*G01D 5/14* (2006.01)
*G01R 33/07* (2006.01)

(52) U.S. Cl.
CPC ........... *G01R 33/038* (2013.01); *G01D 5/145* (2013.01); *G01R 33/07* (2013.01)

(58) Field of Classification Search
CPC ....... G01R 33/038; G01R 33/07; G01D 5/145
See application file for complete search history.

(56) References Cited

U.S. PATENT DOCUMENTS 9,915,552 B2    3/2018   Ausserlechner
2005/0046418 A1    3/2005   Fukaya et al.
(Continued)

FOREIGN PATENT DOCUMENTS

CN       108627081 A    10/2018
DE    102014116826 A1    5/2015
(Continued)

OTHER PUBLICATIONS

Search Report and Written Opinion from EP Application No. EP19220092.1, Jul. 1, 2020.
(Continued)

*Primary Examiner* — Stephanie E Bloss
*Assistant Examiner* — Michael A Harrison
(74) *Attorney, Agent, or Firm* — Workman Nydegger

(57) ABSTRACT

A position sensor system includes a magnetic source for generating a magnetic field, and a position sensor device movable relative to the magnetic source, or vice versa. The position sensor device comprises at least three magnetic sensor elements for measuring at least three magnetic field values of the magnetic field, and a processing circuit configured for determining at least two magnetic field gradients or magnetic field differences based on the at least three magnetic field values, and for deriving from the at least two magnetic field gradients or differences a first value indicative of a position of the position sensor device, and for deriving from the at least two magnetic field gradients or differences a second value indicative of integrity of the position sensor system.

20 Claims, 18 Drawing Sheets

Signal2= $(Vh1-Vh3+Vh5-Vh7)^2 + (Vh0-Vh2+Vh4-Vh6)^2$

Signal2 = $(dBu/du-dBv/dv)^2 + (dBx/dx-dBy/dy)^2$ or Signal2 = $(dBu/du)^2 + (dBx/dx)^2$

(56) References Cited

U.S. PATENT DOCUMENTS

| | | | |
|---|---|---|---|
| 2007/0252587 A1* | 11/2007 | Stauder | G01D 5/2006 324/207.15 |
| 2014/0225596 A1* | 8/2014 | Nakamura | G01D 5/145 324/207.2 |
| 2015/0142376 A1 | 5/2015 | Ausserlechner | |
| 2015/0226581 A1 | 8/2015 | Schott et al. | |
| 2017/0356765 A1 | 12/2017 | Watanabe et al. | |
| 2018/0274896 A1 | 9/2018 | Anagawa et al. | |
| 2018/0292197 A1* | 10/2018 | Furukawa | G01D 3/02 |
| 2018/0372475 A1 | 12/2018 | Yoshiya | |
| 2019/0378639 A1 | 12/2019 | Bidaux | |
| 2020/0149925 A1* | 5/2020 | Bidaux | G01R 33/022 |
| 2020/0284615 A1 | 9/2020 | Hammerschmidt et al. | |

FOREIGN PATENT DOCUMENTS

| | | |
|---|---|---|
| EP | 3543657 A1 | 9/2019 |
| JP | 2018021901 A | 2/2018 |
| JP | 2018109653 A | 7/2018 |
| WO | 2016027838 A1 | 2/2016 |
| WO | 2016116272 A2 | 7/2016 |

OTHER PUBLICATIONS

Chinese Office Action from Corresponding Chinese Patent Application No. CN202011560744.0, Jan. 26, 2025.

* cited by examiner

Signal2= (Vh1-Vh3+Vh5-Vh7)² + (Vh0-Vh2+Vh4-Vh6)²

Signal2 = (dBu/du-dBv/dv)² + (dBx/dx-dBy/dy)² or Signal2 = (dBu/du)² + (dBx/dx)²

Signal2 = (Vh0+Vh1)² + (Vh2+Vh3)²

Signal2 = (dBx/dx)² + (dBu/du)²

Signal2 = (Vh0+Vh1)² + (Vh2+Vh3)²

Signal2 = (dBy/dx)² + (dBv/du)²

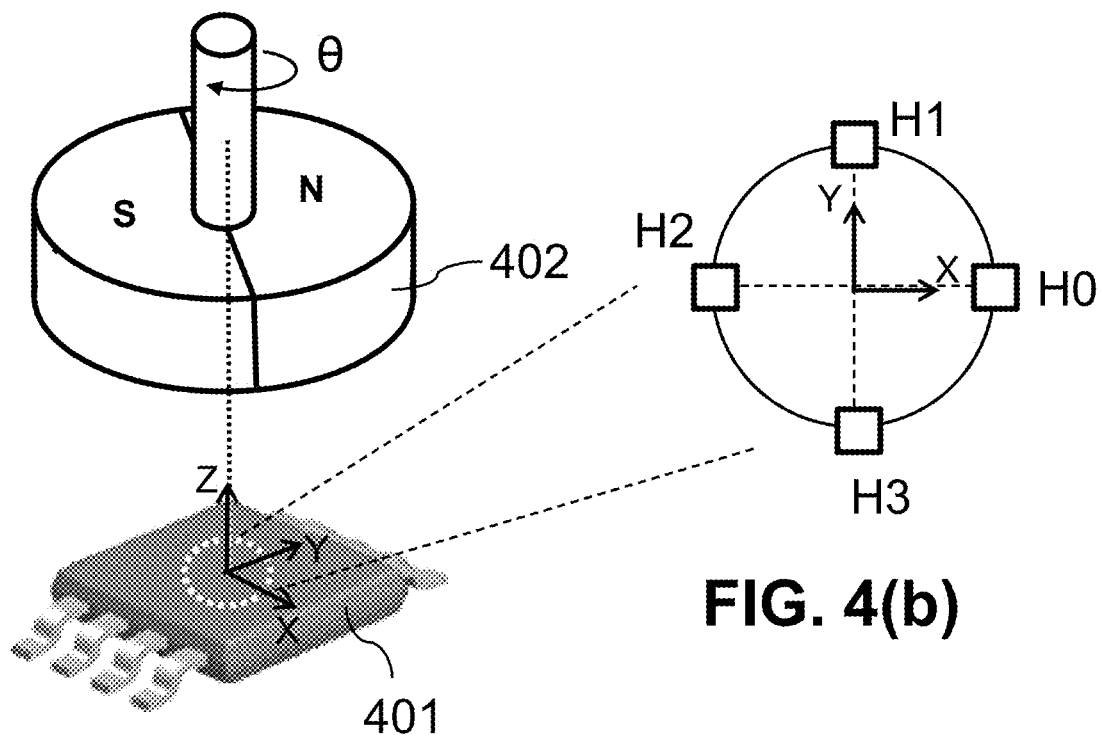
Signal2 = (Vh0-Vh2)² + (Vh1-Vh3)²
Signal2 = (dBz/dx)² + (dBz/dy)²
FIG. 4(a)
FIG. 4(b)

$Signal2 = (Vh0-Vhc)^2 + (Vh1-Vhc)^2$ $Signal2 = (dBz/dx)^2 + (dBz/dy)^2$

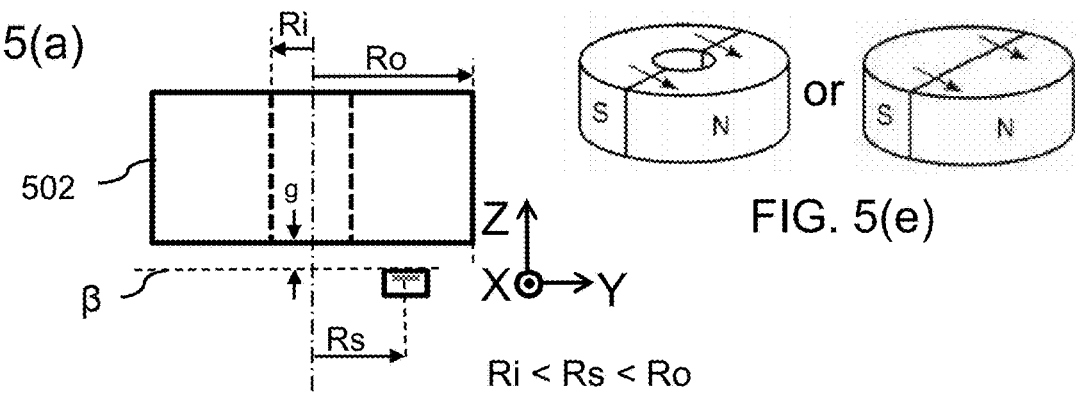
FIG. 5(a)
FIG. 5(e)
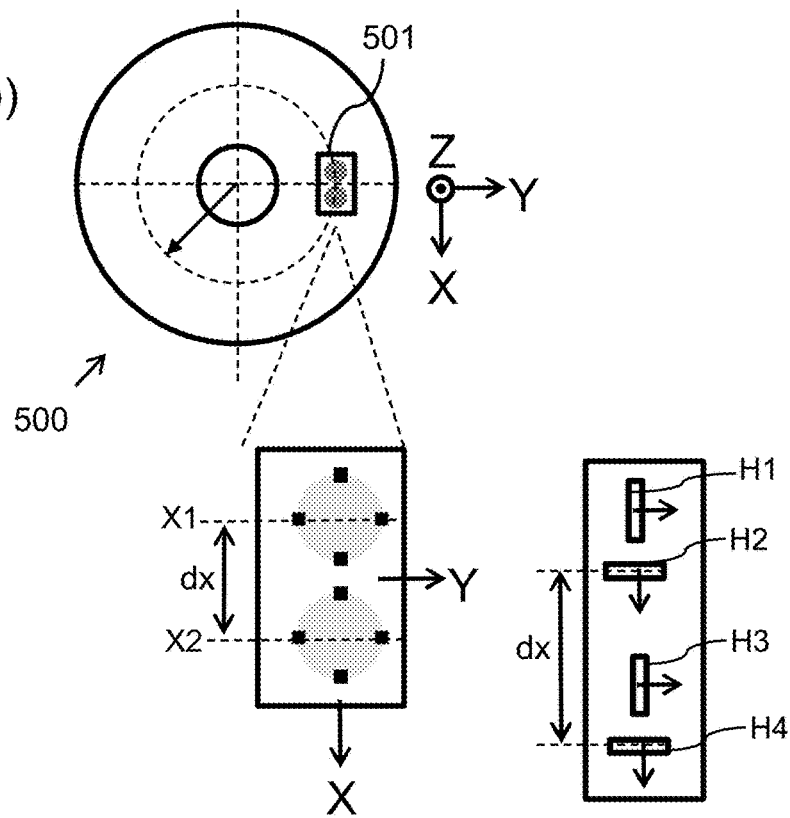
FIG. 5(b)
FIG. 5(c)
FIG. 5(d)
Signal2 = A.(Vh2−Vh4)² + B.(Vh1−Vh3)²
Signal2 = A.(dBx/dx)² + B.(dBy/dx)²
FIG. 5

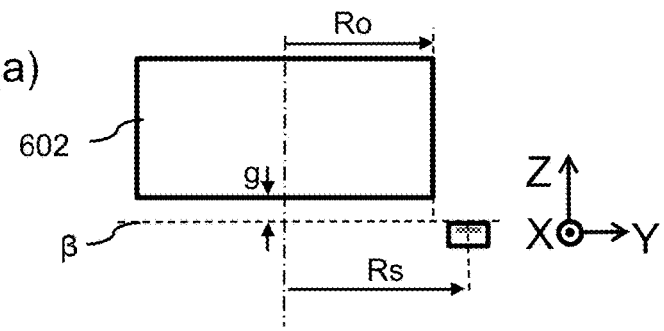
FIG. 6(a)
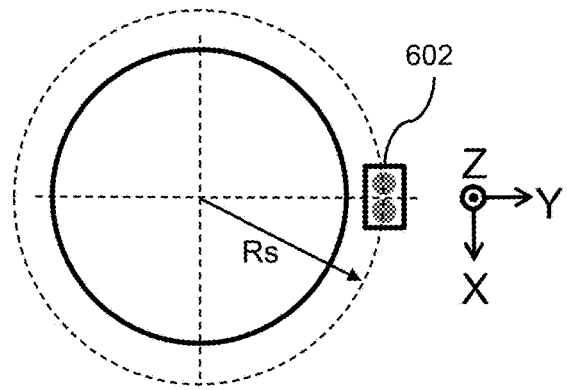
FIG. 6(b)
FIG. 6(c)
FIG. 6(d)
FIG. 6(e)
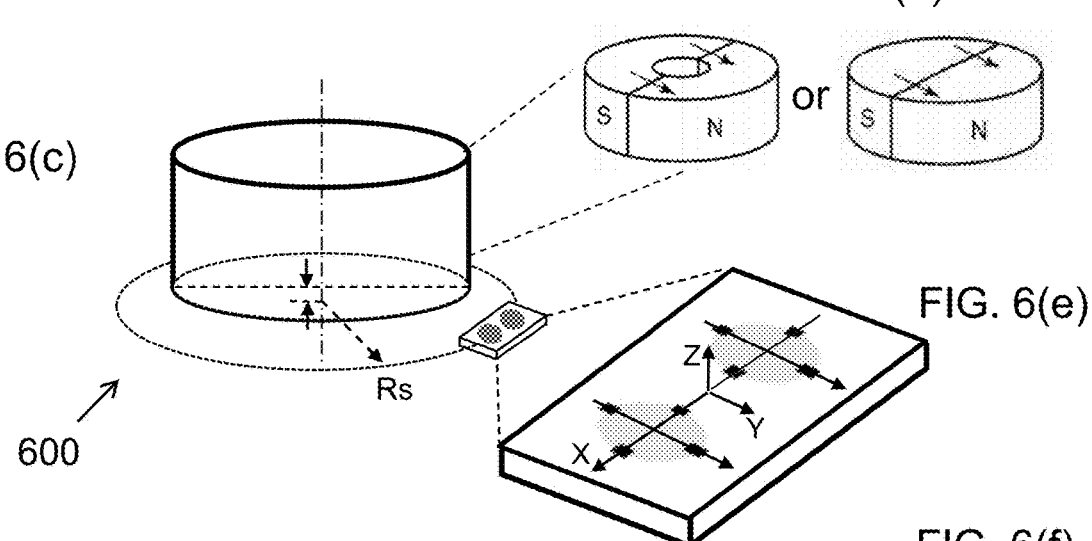
Signal2 = A.(Vh2−Vh4)² + B.(Vh1−Vh3)²
Signal2 = A.(dBx/dx)² + B.(dBz/dx)²
FIG. 6(f)
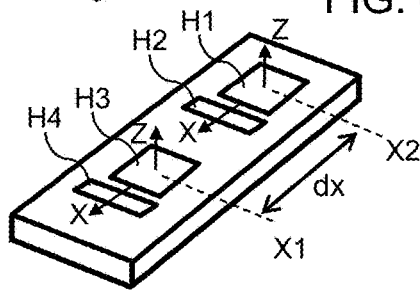
FIG. 6

FIG. 7(a)
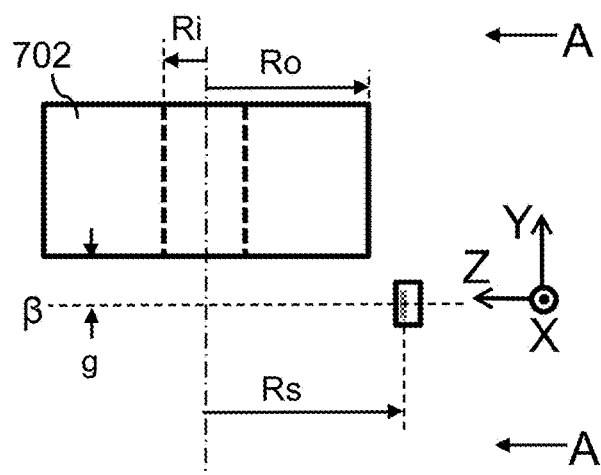
FIG. 7(c)
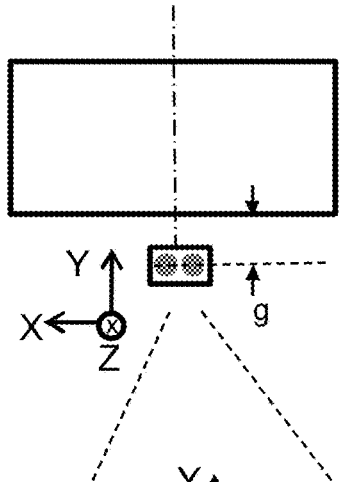
FIG. 7(b)
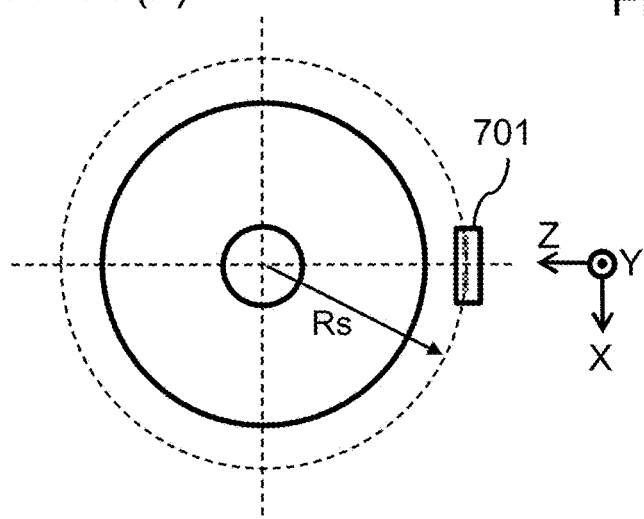
FIG. 7(d)
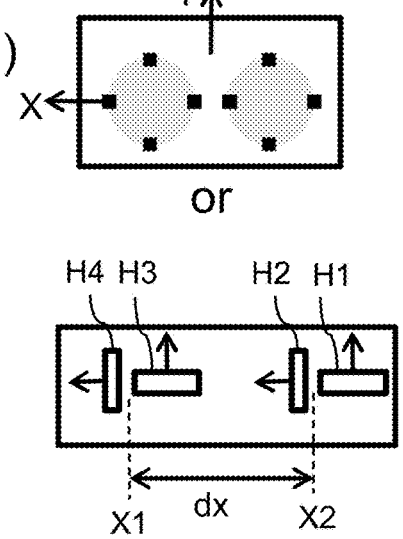
FIG. 7(e)
Signal2 = A.(Vh2−Vh4)² + B.(Vh1−Vh3)²
Signal2 = A.(dBx/dx)² + B.(dBy/dx)²
FIG. 7

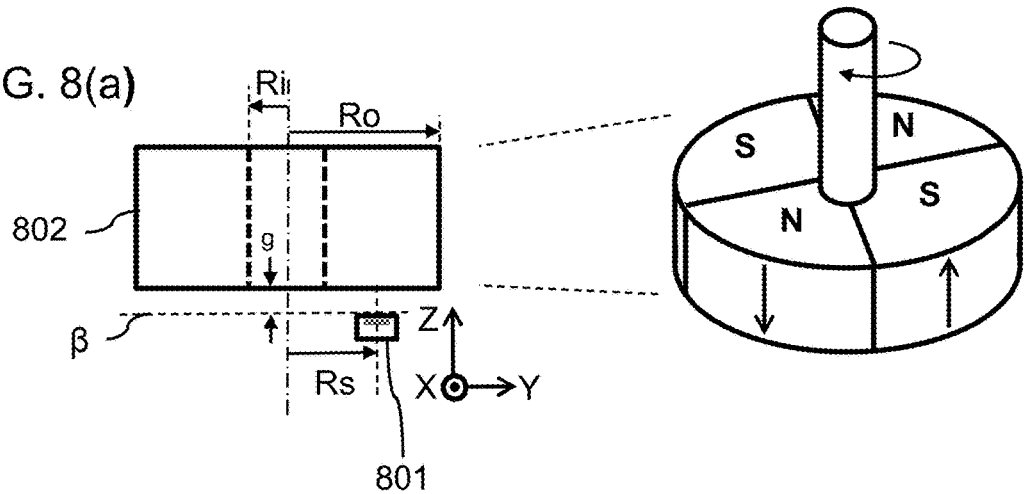
FIG. 8(a)
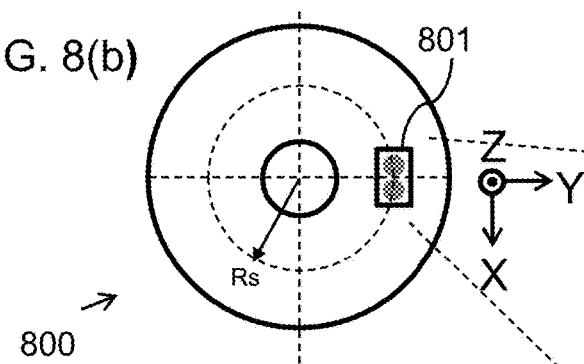
FIG. 8(b)
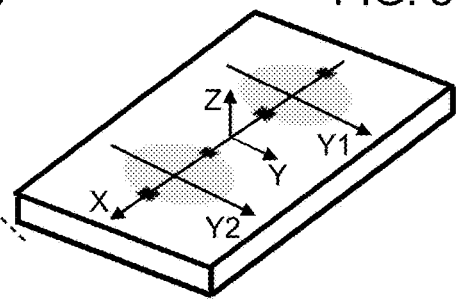
FIG. 8(c)
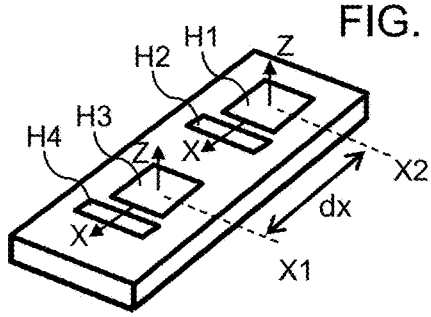
FIG. 8(d)
Signal2 = $A \cdot (dBx/dx)^2 + B \cdot (dBz/dx)^2$
Signal2 = $A \cdot (Vh2-Vh4)^2 + B \cdot (Vh1-Vh3)^2$
FIG. 8

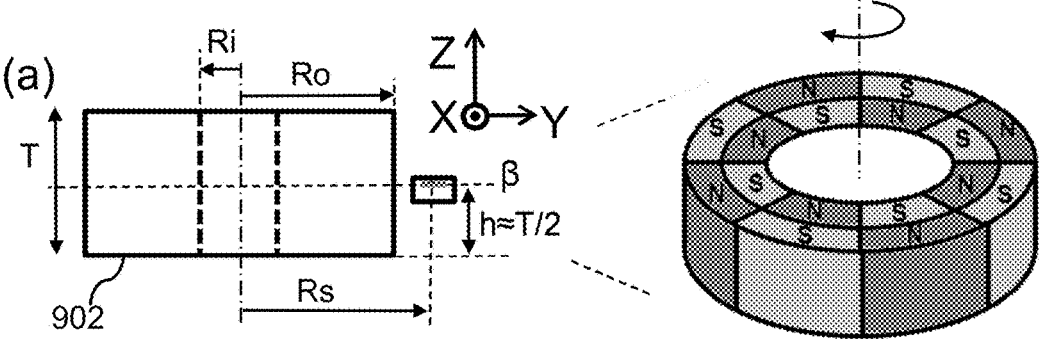
FIG. 9(a)
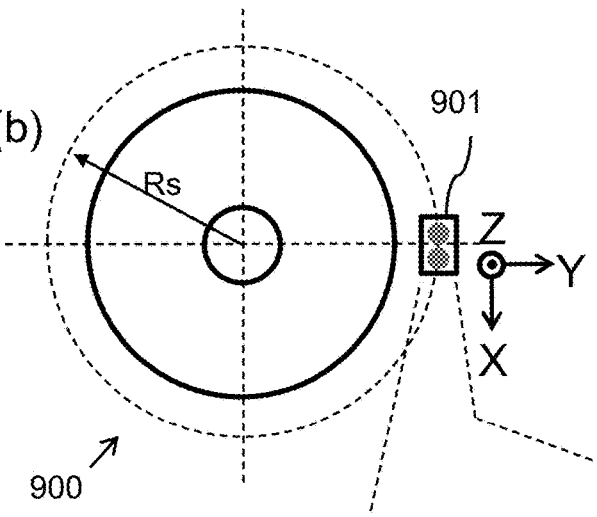
FIG. 9(b)
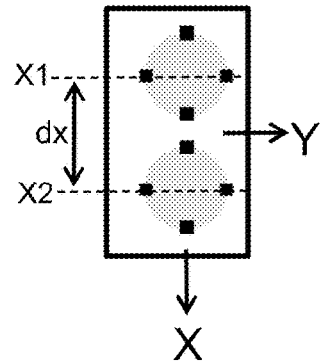
FIG. 9(c)
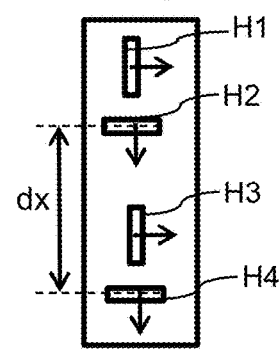
FIG. 9(d)
Signal2 = A.(Vh2−Vh4)² + B.(Vh1−Vh3)²
Signal2 = A.(dBx/dx)² + B.(dBy/dx)²
FIG. 9

$$Signal2 = A.(Vh2-Vh4)^2 + B.(Vh1-Vh3)^2$$
$$Signal2 = A.(dBx/dx)^2 + B.(dBz/dx)^2$$

Signal2 = (Vh1−Vhc)² +(Vh2−Vhc)² +(Vh3−Vhc)²

Signal2' = abs(Vh1−Vhc)+abs(Vh2−Vhc)+abs(Vh3−Vhc)

FIG. 16(a)
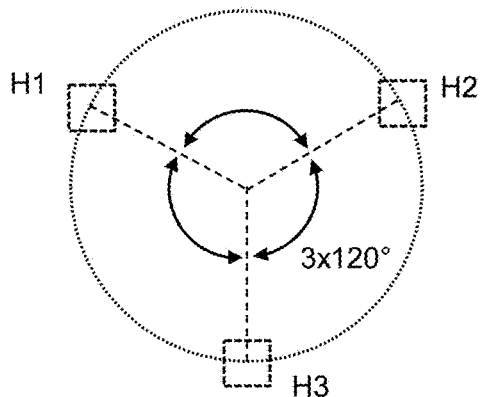
Vavg=(Vh1+Vh2+Vh3)/3
FIG. 16(b)
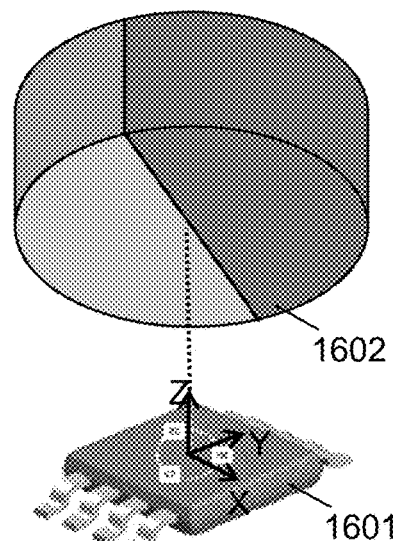
FIG. 16(c)
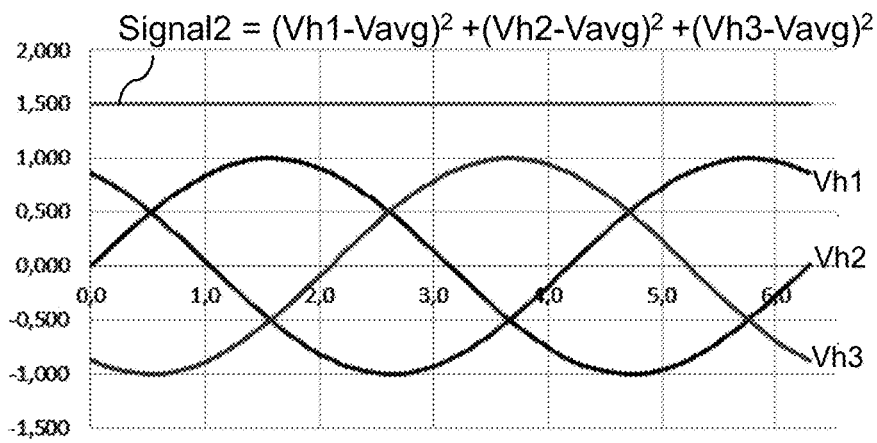
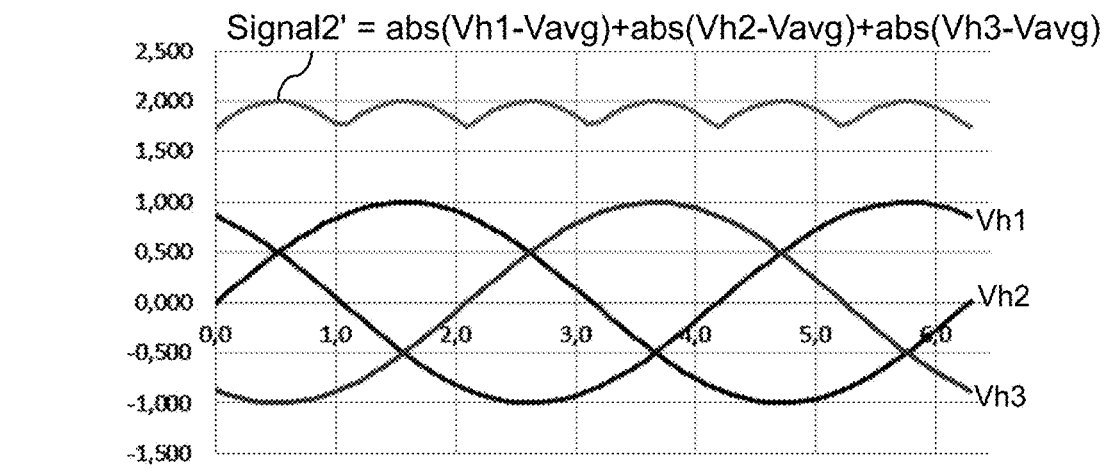
FIG. 16(d)

MAGNETIC POSITION SENSOR SYSTEM AND METHOD

FIELD OF THE INVENTION

The present invention relates in general to the field of magnetic sensor devices and systems and methods, and more in particular to magnetic position sensor systems and devices and methods, capable of not only determining a linear or angular position, but also capable of providing a signal indicative of the integrity of the system or a fault.

BACKGROUND OF THE INVENTION

Magnetic position sensor systems, in particular linear position sensor systems and angular position sensor systems are known in the art. They offer the advantage of being able to measure a linear or angular position without making physical contact, thus avoiding problems of mechanical wear, scratches, friction, etc.

Many variants of position sensor systems exist, addressing one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), etc.

The present invention is mainly concerned with position sensor systems for use in harsh environments, such as e.g. for automotive, industrial and robotic applications, where the primary function of the sensor system is to determine a linear or angular position, even in the presence of electro-magnetic disturbance signals, and where fault detection is an important support function to guarantee functional safety.

SUMMARY OF THE INVENTION

It is an object of embodiments of the present invention to provide a magnetic position sensor system comprising a magnetic source and a sensor device, and which is capable of providing position information and fault information (or integrity information) in a manner which is insensitive to an external disturbance field.

It is a particular object of embodiments of the present invention to provide a magnetic position sensor system capable of detecting a fault condition, e.g. related to the mechanical mounting of the magnetic source.

It is an object of particular embodiments of the present invention to provide such a system comprising a magnetic source, where the sensor device is capable of detecting the presence or absence of the magnetic source.

It is an object of particular embodiments of the present invention to provide an angular position sensor system comprising a permanent magnet which is rotatable about a rotation axis, and where the sensor device preferably has a measurement range of 360° or 180°.

It is an object of particular embodiments of the present invention to provide a linear position sensor system comprising an elongated magnetic structure.

It is an object of embodiments of the present invention to provide such a system, where the determination of a fault or the system integrity requires less processing power or only simple arithmetic.

These and other objectives are accomplished by a system, a device, and a method provided by the present invention.

According to a first aspect, the present invention provides a position sensor system, comprising: a magnetic field source for generating a magnetic field; a position sensor device movable relative to the magnetic field source or vice versa, the position sensor device comprising: at least three magnetic sensitive elements for measuring at least three magnetic field values of said magnetic field; a processing circuit configured for obtaining said at least three magnetic field values, and for determining at least two magnetic field gradients or at least two magnetic field differences based on said at least three magnetic field values, and for deriving from said at least two magnetic field gradients or from said at least two magnetic field differences a first signal (or a first value) indicative of a position (e.g. linear or angular position) of the magnetic source relative to the position sensor device (or vice versa); wherein the processing circuit is further configured for deriving from said at least two magnetic field gradients or from said at least two magnetic field differences a second signal indicative of a fault (e.g. an electrical fault and/or a mechanical fault) or the integrity of the position sensor system.

The fault signal (or integrity signal) may e.g. be indicative of the presence or absence of the magnetic source.

It is a major advantage of determining the relative position based on magnetic field gradients or magnetic field differences, because such position is highly insensitive to an external disturbance field.

It is a major advantage of this system that it not only provides a first signal (or first value) indicative of the position (e.g. linear or angular), but also provides a second signal indicative of a fault, because in this way certain problems (e.g. electrical defects and/or mechanical defects, such as a defective Hall element, or a broken magnet) can be detected, and the overall system in which this position sensor system is used, can be made safer.

As far as is known to the inventors, magnetic field gradients or magnetic field differences are not used in the prior art for fault-detection or for verifying electrical or mechanical or system integrity.

It is a major advantage that the integrity signal itself is also based on magnetic field gradients or magnetic field differences, such that the integrity signal itself is also highly insensitive to an external disturbance field.

This system is ideally suited for use in a harsh environment, such as e.g. an automotive environment, an industrial environment, or a robotic environment.

In an embodiment, in each sensor position only a single magnetic field component (e.g. Bz oriented perpendicular to the semiconductor substrate) is measured (see for example FIG. 1 to FIG. 4 and FIG. 14(a) to FIG. 16(d)).

In an embodiment, two orthogonal magnetic field components (e.g. Bx and Bz, or Bx and By) are measured in each of two different sensor locations (see for example FIG. 5 to FIG. 11), e.g. a first and a second sensor location, which sensor locations are preferably spaced apart by at at least 1.0 mm, e.g. by about 1.5 to about 2.5 mm, e.g. by a distance of about 2.0 mm.

The sensor device may be further configured for providing said first signal or value as a position signal, and for providing said second signal or value (or a value derived therefrom) as an integrity signal and/or a warning signal and/or an error signal.

In an embodiment, the position sensor device is further configured for outputting the first signal indicative of the relative position, and for outputting the second signal or a signal derived therefrom as a separate signal.

In an embodiment, the first signal is provided (e.g. as a digital signal or as an analog signal) on a first output port, and the second signal is provided (e.g. as a digital signal or as an analog signal) on a second output port different from the first output port.

In an embodiment, the first signal and the second signal are provided as separate values in a serial bit-stream.

In an embodiment, the sensor device is movable with respect to the magnetic source.

In an embodiment, the magnetic source is movable with respect to the sensor device. For example, the magnetic source may be mounted to a rotatable axis, and the sensor device may be mounted to a stator or to a frame.

In an embodiment, the sensor device comprises at least three magnetic sensor elements oriented in a single direction; and the processing circuit is configured for determining at least three magnetic field differences based on said at least three magnetic field values, and for deriving said first signal from said at least three magnetic field differences; and for deriving said second signal from said at least three magnetic field differences.

In an embodiment, the sensor device is further configured for determining said second signal as a polynomial expression of said at least two magnetic field gradients, the polynomial expression having an order of at least two.

In an embodiment, the sensor device is further configured for determining said second signal as a polynomial expression of said at least two or said at least three magnetic field differences, the polynomial expression having an order of at least two, e.g. as a sum of squares of said differences.

The coefficients may be predetermined during design, or may be determined during a calibration test and written in a non-volatile memory (e.g. flash) embedded in the sensor device), and may be read from said non-volatile memory during actual use of the device.

In an embodiment, the polynomial expression is a second order polynomial with non-zero first-order terms, e.g. according to the formula: second signal=A*sqr(gradient1)+B*sqr(gradient2)+C*(gradient1*gradient2)+D*(gradient1)+E*(gradient2)+F, wherein gradient1 is a first gradient derived from at least three magnetic field values, and gradient2 is a second gradient derived from said at least three magnetic field values, different from the first gradient, and A, B, C, D, E and F are constant values, e.g. predetermined values. Each of the value A and B is different from zero. The values C, D, E and F may be equal to zero, or may be different from zero.

In a particular embodiment, the values of C and D and E are equal to zero.

In a particular embodiment, the values of C and D and E and F are equal to zero.

In an embodiment, the polynomial expression is a third order polynomial or a fourth order polynomial.

In an embodiment, coefficients of the polynomial expression are chosen such that the second signal is substantially constant (within a predefined tolerance margin of ±25%, or ±20%, or ±15%, or ±10%, or ±5%), irrespective of the relative position, for envisioned (valid) positions in a correct mechanical mounted system.

In an embodiment, the sensor device is further configured for determining said second signal as a sum of absolute values of said at least two or said at least three magnetic field gradients.

In an embodiment, the sensor device is further configured for determining said second signal as a sum of absolute values of said at least two or said at least three differences.

In an embodiment, the second signal is chosen such that the second signal is substantially independent of the relative position, over the entire measurement range.

With "substantially constant" is meant within a relatively small range around a predefined value, e.g. within a range of ±25% around said predefined value, or within a range of ±20% around said predefined value, or within a range of ±15% around said predefined value, or within a range of ±10% around said predefined value, or within a range of ±5% around said predefined value, or even within a range of ±2% around said predefined value.

It is an advantage of this embodiment that the second signal is substantially constant for any position of the sensor device with respect to the magnetic source, because it allows to check (inter alia) the integrity of the mechanical mounting, e.g. to detect a mechanical mounting problem, without knowing or without taking into account the actual position.

In an embodiment, the sensor device is further configured for comparing the second signal with at least one threshold value, and for providing an output signal (e.g. a warning signal and/or an error signal) corresponding to an outcome of the at least one comparison.

In an embodiment, the position sensor system is connected to an external processor, and is configured for providing the second signal (or a value derived therefrom) to said external processor, and the external processor is configured for comparing the second signal with at least one threshold value.

In this embodiment, the actual comparison is performed outside of the sensor device, e.g. in an external processor, e.g. in an ECU.

In an embodiment, the position sensor system is connected to an external processor, and is configured for providing the at least two gradient values or the at least two gradient signals or the at least two or the at least three magnetic field differences to said external processor, and the external processor is configured for calculating the second signal based on these at least two gradients or these at least two or at least three differences.

In this embodiment, the actual calculation of the second signal is performed outside of the sensor device, e.g. in an external processor, e.g. in an ECU.

In an embodiment, the position sensor device is configured for outputting the first signal indicative of the relative position and is further configured for comparing the second signal with a first threshold value (T1) and with a second threshold value (T2), and for providing a second output signal indicative of whether the second signal is a value between the first and the second threshold value.

In an embodiment (e.g. as illustrated in FIG. 1 to FIG. 4 or FIG. 14(a) to FIG. 16(d)), the magnetic field source is a permanent magnet (e.g. a ring magnet or a disk magnet), rotatable about a rotation axis; and the sensor device is configured for determining an angular position, and is located substantially on said axis. Such mechanical arrangement is also referred to herein as an "on-axis" arrangement.

In an embodiment, the magnetic field source is a permanent magnet having at least four poles, (e.g. an axially magnetized four-pole or six-pole or eight-pole disk magnet, or an axially magnetized four-pole or six-pole or eight-pole ring magnet), and the sensor device comprises a semiconductor substrate oriented substantially orthogonal to the rotation axis, the semiconductor substrate comprising a plurality of at least four pairs of sensor elements, each pair configured for measuring magnetic field values (e.g. Bx, By, Bu, By) in different directions (e.g. X, Y, U, V) parallel to the substrate; and the sensor device is further configured for determining at least four magnetic field gradients or magnetic field differences associated with said at least four pairs of signals.

The second signal may be a polynomial expression of two different linear combinations of said at least four magnetic field gradients or differences, or a value derived therefrom.

The second signal may be a weighted sum of squares of two different linear combinations of said at least four magnetic field gradients or differences, or a value derived therefrom.

In an embodiment, the at least eight sensor elements are located on a virtual circle.

In an embodiment, the magnetic field source is a permanent magnet having four poles, (e.g. an axially magnetized four-pole disk magnet, or an axially magnetized four-pole ring magnet), and the semiconductor substrate comprises at least eight sensor elements located on a virtual circle; and the sensor device is configured for determining at least four magnetic field gradients (e.g. dBx/dy, dBy/dx, dBu/dv, dBv/du) along at least four different directions (e.g. U,V,X,Y) parallel to the substrate and angularly spaced by 45°; and the second signal is calculated in accordance with the following formula:

Signal2=$(dBx/dx-dBy/dy)^2$, or according to the following formula:

Signal2=$(dBu/du-dBv/dv)^2+(dBx/dx-dBy/dy)^2$, or a value derived therefrom.

In an embodiment (e.g. as illustrated in FIG. 4(c)), the magnetic field source is a two-pole permanent magnet, (e.g. a bar magnet or a diametrically magnetized two-pole disk magnet, or a diametrically magnetized two-pole ring magnet, or an axially magnetized two-pole disk magnet, or an axially magnetized two-pole ring magnet), and the sensor device comprises: a semiconductor substrate oriented substantially orthogonal to the rotation axis, the semiconductor substrate comprising at least three or at least four sensor elements, each sensor element configured for measuring a magnetic field component (e.g. Bz) oriented in a direction substantially perpendicular to the semiconductor substrate; and the sensor device is further configured for determining two magnetic field gradients (e.g. dBz/dx; dBz/dy) of said magnetic field values (e.g. Bz) along two orthogonal directions (e.g. X, Y) parallel to the semiconductor substrate.

The second signal may be determined as a weighted sum of squares of these gradients.

In an embodiment (e.g. as illustrated in FIG. 4(b)), the semiconductor substrate contains four horizontal Hall elements without IMC (Integrated Magnetic Concentrators), located on a virtual circle, angularly spaced apart by 90°.

In an embodiment (e.g. as illustrated in FIG. 4(c)), the semiconductor substrate contains three or only three horizontal Hall elements without IMC (integrated magnetic concentrators), two of these being located on a virtual circle, spaced apart 90°, one of these being located in the centre of the virtual circle, thus forming an L-shape or a right-angled triangle.

In an embodiment, the second signal is the sum or weighted sum of squares of these magnetic field gradients, or a value derived therefrom. The sum can e.g. be written in mathematical form as: signal2=$(dBz/dx)^2+(dBz/dy)^2$. The weighted sum can e.g. be written as: signal2=$A\cdot(dBz/dx)^2+B\cdot(dBz/dy)^2$.

The sensor device may furthermore test whether this sum lies in a predefined range, or may for example calculate a square-root of this sum, and test whether the square root is smaller than a first threshold value or larger than a second threshold value, etc.

In an embodiment (see e.g. FIG. 5 to FIG. 10), the magnetic field source is a permanent magnet, rotatable about a rotation axis; and the sensor device is configured for determining an angular position, and is located at a non-zero distance from said rotation axis. For example, the sensor device may be located such that its magnetic centre is located at a distance of at least 3 mm, or at least 4 mm from said rotation axis.

In an embodiment (see e.g. FIG. 5), the magnetic field source is a two-pole permanent magnet, (e.g. a diametrically magnetized two-pole disk magnet, or a diametrically magnetized two-pole ring magnet, or an axially magnetized two-pole disk magnet, or an axially magnetized two-pole ring magnet) and the sensor device is configured for measuring first magnetic field components (e.g. Bx) oriented in a circumferential direction (e.g. X) about the rotation axis, and second magnetic field components (e.g. By) oriented in a radial direction (e.g. Y) with respect to the rotation axis; and the sensor device is configured for determining a first magnetic field gradient (e.g. dBx/dx) of the first magnetic field components (e.g. Bx) along said circumferential direction (e.g. X), and for determining a second magnetic field gradient (e.g. dBy/dx) of the second magnetic field component (e.g. By) along said circumferential direction (e.g. X); and the sensor device is further configured for calculating the second signal as a function of this first and second magnetic field gradient, for example as the sum of the squares of these magnetic field gradients.

In an embodiment (e.g. as illustrated in FIG. 5 and FIG. 8), the permanent magnet is a ring magnet having an inner radius (Ri) and an outer radius (Ro), and the sensor device is located such that its magnetic centre is located at a distance (Rs) between said inner radius and said outer radius, e.g. substantially halfway between said inner and outer radius.

In an embodiment (e.g. as illustrated in FIG. 6 or FIG. 7), the magnetic field source is a two-pole permanent magnet, (e.g. a diametrically magnetized two-pole disk magnet, or a diametrically magnetized two-pole ring magnet, or an axially magnetized two-pole disk magnet, or an axially magnetized two-pole ring magnet) and the sensor device is configured for measuring first magnetic field components (e.g. Bx) oriented in a circumferential direction (e.g. X) about the rotation axis, and second magnetic field components (e.g. Bz) oriented in a direction (e.g. Z) parallel to the rotation axis; and wherein the sensor device is configured for determining a first magnetic field gradient (e.g. dBx/dx) of the first magnetic field components (e.g. Bx) along said circumferential direction (e.g. X), and for determining a second magnetic field gradient (e.g. dBz/dx) of the second magnetic field components (e.g. Bz) along said circumferential direction (e.g. X); and the sensor device is further configured for calculating the second signal as a function of this first and second magnetic field gradient, for example as a sum or weighted sum of the squares of these magnetic field gradients.

In an embodiment, the permanent magnet has an outer radius (Ro), and the sensor device is located such that its magnetic centre is located at a distance (Rs) in the range from 80% to 120% of said outer radius, or in the range from 90% to 110% of said outer radius, or in the range from 95% to 105% of said outer radius.

In an embodiment (e.g. as illustrated in FIG. 8), the magnetic field source is a permanent magnet having at least four poles, (e.g. an axially magnetized four-pole or six-pole or eight-pole disk magnet, or an axially magnetized four-pole or six-pole or eight-pole ring magnet) and the sensor device is configured for measuring first magnetic field components (e.g. Bx) oriented in a circumferential direction (e.g. X) with respect to the rotation axis, and second magnetic field components (e.g. Bz) oriented in a direction (e.g. Z) parallel to the rotation axis; and the sensor device is configured for determining a first magnetic field gradient (e.g. dBx/dx) of the first magnetic field components (e.g. Bx) along said circumferential direction (e.g. X), and for determining a second magnetic field gradient (e.g. dBz/dx) of the second magnetic field components (e.g. Bz) along said circumferential direction (e.g. X); and the sensor device is further configured for calculating the second signal as a function of this first and second magnetic field gradient, for example as the sum or weighted sum of the squares of these magnetic field gradients.

In an embodiment (e.g. as illustrated in FIG. 9 and FIG. 10), the magnetic field source is a permanent magnet having at least four poles, (e.g. an axially magnetized four-pole or six-pole or eight-pole disk magnet, or an axially magnetized four-pole or six-pole or eight-pole ring magnet) and the sensor device is configured for measuring first magnetic field components (e.g. Bx) oriented in a circumferential direction (e.g. X) with respect to the rotation axis, and second magnetic field components (e.g. Br) oriented in a radial direction with respect to the permanent magnet; and the sensor device is configured for determining a first magnetic field gradient (e.g. dBx/dx) of the first magnetic field components (e.g. Bx) along said circumferential direction (e.g. X), and for determining a second magnetic field gradient (e.g. dBr/dx) of the second magnetic field components (e.g. Br) along said circumferential direction (e.g. X); and the sensor device is further configured for calculating the second signal as a function of this first and second magnetic field gradient, for example as the sum or weighted sum of the squares of these magnetic field gradients.

In an embodiment, the permanent magnet has an outer radius (Ro), and the sensor device is located such that its magnetic centre is located at a distance (Rs) of 105% to 200% of said outer radius, or in the range from 105% to 150% of said outer radius, or in the range from 105% to 140% of said outer radius. Furthermore, in this embodiment, the sensor device is preferably located at an axial position substantially halfway between a bottom surface and a top surface of the permanent magnet.

In an embodiment (e.g. as illustrated in FIG. 11) the magnetic field source is a magnetic structure having an elongated shape extending in a first direction (e.g. X) and having a plurality of at least two, or at least three, or at least four magnetic poles magnetized in a second direction (e.g. Z) substantially perpendicular to the first direction (e.g. X); and the sensor device is movable in the first direction (e.g. X) relative to the magnetic structure, or vice versa, and is configured for determining a linear position in the first direction (e.g. X); and a distance (measured in the second direction, e.g. Z) between the sensor device and the magnetic structure is substantially constant; and the sensor device is configured for measuring first magnetic field components (e.g. Bx) oriented in the first direction (e.g. X), and second magnetic field components (e.g. Bz) oriented in the second direction (e.g. Z); and the sensor device is configured for determining a first magnetic field gradient (e.g. dBx/dx) of the first magnetic field component (e.g. Bx) along said first direction (e.g. X), and for determining a second magnetic field gradient (e.g. dBz/dx) of the second magnetic field component (e.g. Bz) along said first direction e.g. (X); and the sensor device is configured for calculating the second signal as a function of this first and second magnetic field gradient, for example as the sum or weighted sum of the squares of these magnetic field gradients.

Preferably the magnetic structure has a symmetry plane parallel to the first direction (e.g. X) and second direction (e.g. Z), and preferably the sensor device is located such that its magnetic center is located substantially in this symmetry plane.

According to another aspect, the present invention is also directed to a sensor device for use in any of the above-mentioned position sensor systems, e.g. for use in an automotive or industrial or robotic environment.

According to another aspect, the present invention also provides a method of determining a position and of determining a fault or an integrity of a sensor system according to the first aspect. The method comprises the steps of: a) measuring at least three magnetic field values of said magnetic field; b) determining at least two magnetic field gradients or at least two or at least three magnetic field differences based on said at least three magnetic field values; c) deriving from said at least two magnetic field gradients or from said at least two or said at least three magnetic field differences a first signal indicative of a position of the sensor device; d) deriving from said at least two magnetic field gradients or from said at least two or said at least three magnetic field differences a second signal indicative of a fault, or indicative of an integrity of the position sensor system, e.g. indicative of the presence or absence of the magnetic source in the vicinity of the sensor device.

This method is ideally suited for use in a harsh environment, such as e.g. an automotive environment, an industrial environment, or a robotic environment.

The method may further comprise the step of providing said first signal as a first output signal and providing said second signal as a second output signal. The first and second output signal may be analog signals or may be digital signals, or one signal can be digital, and the other signal can be analog.

In an embodiment, step d) comprises: determining said second signal as a polynomial expression of said at least two magnetic field gradients, e.g. as a sum or weighted sum of squares of gradient signals, or as a sum of squares of difference signals, or as a sum of absolute values of difference signals.

The method may further comprise the step of: obtaining coefficients of said polynomial expression from a non-volatile memory.

The method may further comprise step e) of: comparing the second signal with at least one threshold value or with at least two threshold values; and outputting at least one signal (e.g. a warning signal and/or an error signal) corresponding to an outcome of said at least one comparison or said at least two comparisons.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

BRIEF DESCRIPTION OF THE DRAWINGS

FIG. 4(a) and FIG. 4(b) show an angular position sensor system according to another embodiment of the present invention. This position sensor system comprises a two-pole magnet rotatable around a rotation axis, and a sensor device located in an "on-axis" position and having four horizontal Hall elements without IMC (Integrated Magnetic Concentrator).

FIG. 5, including FIGS. 5(a) to 5(e), shows an angular position sensor system according to another embodiment of the present invention. This position sensor system comprises a two-pole magnet rotatable around a rotation axis, and a sensor device located in an "off-axis" position (e.g. above or below the magnet), and configured for measuring two circumferential field components and two radial field components. The sensor device has a substrate oriented substantially perpendicular to the rotation axis.

FIG. 6, including FIGS. 6(a) to 6(f), shows an angular position sensor system according to another embodiment of the present invention. This position sensor system comprises a two-pole magnet rotatable around a rotation axis, and a sensor device located near a "corner" position and configured for measuring two circumferential and two axial field components. The sensor device has a substrate oriented substantially perpendicular to the rotation axis.

FIG. 7, including FIGS. 7(a) to 7(e), shows an angular position sensor system according to another embodiment of the present invention. This position sensor system comprises a magnet (e.g. a two-pole or four-pole magnet, or a magnet having more than four-poles) rotatable around a rotation axis, and a sensor device located near a "corner" position, and configured for measuring two circumferential and two axial field components. The sensor device has a substrate oriented substantially parallel to the rotation axis.

FIG. 8, including FIGS. 8(a) and 8(d), shows an angular position sensor system according to another embodiment of the present invention. This position sensor system comprises a four-pole magnet rotatable around a rotation axis, and a sensor device located in an "off-axis" position (e.g. above or below the magnet), and configured for measuring two circumferential and two axial magnetic field components. The sensor device has a substrate oriented substantially perpendicular to the rotation axis.

FIG. 9, including FIGS. 9(a) to 9(d), shows an angular position sensor system according to another embodiment of the present invention. This position sensor system comprises a four-pole magnet rotatable around a rotation axis, and a sensor device located in a plane substantially perpendicular to the rotation axis and located substantially midway between the top and bottom of the magnet. The sensor device is configured for measuring two circumferential and two radial magnetic field components.

FIGS. 10(a) to 10(e), shows an angular position sensor system according to another embodiment of the present invention. This position sensor system comprises a four-pole magnet rotatable around a rotation axis, and a sensor device having a substrate oriented substantially parallel to the rotation axis and located substantially midway between the top and bottom surface of the magnet. The sensor device is configured for measuring two circumferential and two radial magnetic field components.

FIGS. 11(a) to 11(c), shows a linear position sensor system according to another embodiment of the present invention. This position sensor system comprises a multi-pole magnetic structure having an elongated shape extending in a first direction and having a plurality of magnetic poles magnetised in a second direction substantially perpendicular to the first direction, and a sensor device configured for measuring two magnetic field components oriented in the first direction and two magnetic field components oriented in the second direction.

FIG. 16(a) and FIG. 16(b) show another sensor system comprising a two-pole magnet and a sensor device comprising three horizontal Hall elements located on a virtual circle and angularly spaced apart by multiples of 120°; FIG. 16(c) shows simulation results of a sum of squares of differences between each magnetic field component and an average of the three signals; FIG. 16(d) shows simulation results of a sum of absolute values of differences between each magnetic field component and an average of the three signals.

Figure 1A:
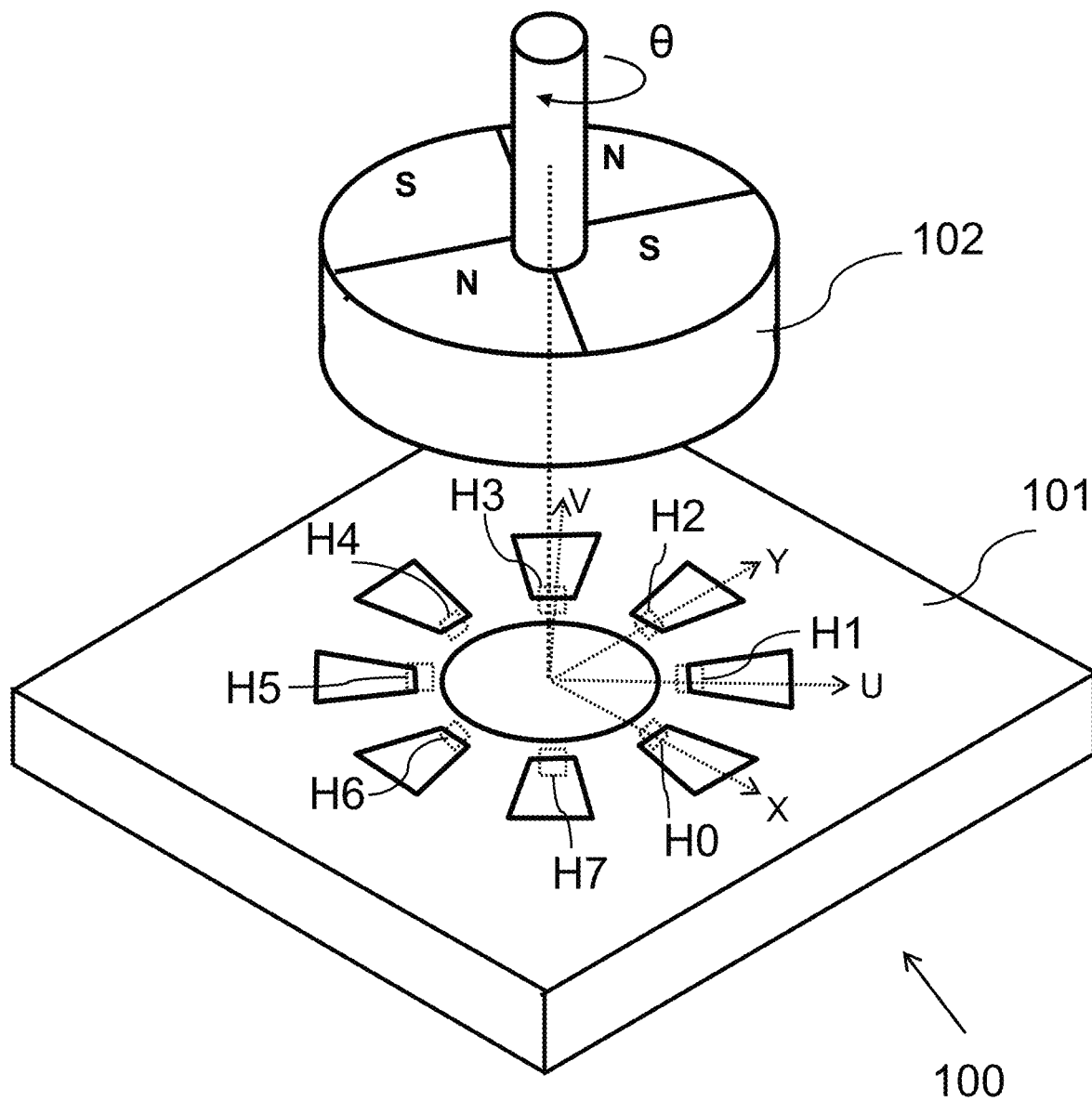
FIG. 1(a) shows an angular position sensor system according to an embodiment of the present invention. This position sensor system comprises a four pole magnet rotatable around a rotation axis, and a sensor device located in an "on-axis" position and having eight horizontal Hall elements and an IMC structure.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the term "magnetic sensor device" or "sensor device" or "position sensor device" refers to a device comprising a substrate, preferably a semiconductor substrate, comprising at least two "magnetic sensor elements". The sensor device may be comprised in a package, also called "chip", although that is not absolutely required.

In the embodiments shown in FIG. 5 to FIG. 10, (where the sensor device is not located with its magnetic center on the rotation axis), the Bx-component typically refers to the magnetic field component oriented in a direction parallel to the movement direction in case of a linear position sensor, or tangential to the movement trajectory in case of a curved trajectory, and the By-component refers to the magnetic field component parallel to the semiconductor plane, perpendicular to the Bx-component. The Bx and By components are also referred to herein as "in-plane magnetic field components", because they are oriented parallel to the semiconductor plane of the sensor device. In these embodiments, the Bz component typically refers to the magnetic field component oriented perpendicular to the sensor substrate. The Bz component is also referred to herein as "out-of-plane component".

In this document, the expression "spatial derivative" or "derivative" or "spatial gradient" or "gradient" are used as synonyms. In the context of the present invention, the gradient is typically determined as a difference between two values obtained from magnetic sensors which are sensitive in the same direction, and which are spaced apart from each other, or as the sum of two values if the sensor elements from which they are obtained are sensitive in opposite directions. Thus, the derivative dBx/dx is typically calculated herein as (Bx1−Bx2), where Bx1 means the Bx component measured at a first location, and Bx2 means the Bx component measured at a second location spaced apart from the first location by a distance "dx" along the X-axis, but the mathematical division by "dx" is typically omitted. Likewise, dBy/dx is typically calculated as (By1−By2), where By1 means the By component measured at a first location, and By2 means the By component measured at a second location spaced apart from the first location by a distance "dx" along the X-axis, but the mathematical division by "dx" is typically omitted. However, for example in FIG. 2 and FIG. 3, the gradient dBx/dx is calculated as the sum of Vh0 and Vh1 (not the difference), because the vertical Hall elements H0 and H1 are oriented in opposite directions.

In this document, the expression "first value" and "first signal" can be used interchangeably. Likewise, the expression "second value" and "second signal" can be used interchangeably.

In this document, the term arctan function or atan 2 function refer to an arctangent function. The reader not familiar with the atan 2 function (or "2-argument arctangent" function) may for example refer to https://en.wikipedia.org/wiki/Atan2 for more information. In the context of the present invention, the formulas arctan(x/y), atan 2(x,y), arccot(y/x) are considered to be equivalent.

In this document, the term "circumferential direction with respect to the rotation axis" and "circumferential direction with respect to the magnet" and "direction tangential to a virtual circle having a center located on the rotation axis" are used interchangeably. In the embodiments of FIG. 5 to FIG. 10, this direction is denoted by the X-axis (as seen by the sensor device).

The present invention relates to position sensor system in harsh environments, such as automotive, industrial and robotic applications. One challenge in such environments is to achieve accurate results despite potentially relatively large disturbance signals. Another challenge is related to functional safety. The design of safety-related applications may be governed by safety standards such as ISO26262 and IEC61508.

More specifically, the present invention proposes a magnetic position sensor system capable not only of providing an accurate position signal, but also capable of providing a second signal indicative of the integrity of the system, or stated in other words, capable of indicating a fault condition, e.g. an electrical and/or mechanical fault condition. One such fault condition is the loss of the magnet, e.g. due to mechanical forces exerted upon the magnetic source, for example when mounted on a shaft.

In order to solve this problem, the present invention proposes a position sensor system comprising a magnetic field source (e.g. a permanent magnet or a permanent magnet structure) and a position sensor device. The magnetic field source is configured for generating a magnetic field. The position sensor device is movable relative to the magnetic field source, or vice versa. The position sensor device comprises at least three magnetic sensitive elements for measuring at least three magnetic field values of said magnetic field; and a processing circuit configured for determining at least two magnetic field gradients or at least two or at least three magnetic field differences based on said at least three magnetic field values, and for deriving from said at least two magnetic field gradients or from said at least two or at least three magnetic field differences a first signal indicative of a position of the magnetic source relative to the position sensor device (or vice versa), and for deriving from said at least two magnetic field gradients or from said at least two or at least three magnetic field differences also a second signal indicative of a fault condition or of the integrity, e.g. mechanical integrity or a mechanical fault condition of the position sensor system, e.g. indicative of the presence or absence of the magnetic source, or indicative of a mechanically misaligned magnet or a physically broken magnet.

Magnetic position systems where spatial gradients are used to determine a linear or angular position are known in the art, but as far as is known to the inventors, such systems have no provisions for detecting (e.g. mechanical) fault conditions, for example either no provision at all, or no provision which is robust against an external disturbance field. The inventors of the present invention however surprisingly found that the gradient signals can also be used to determine mechanical mounting problems, such as the loss of the magnetic source.

The second signal indicative of a fault (e.g. system fault) or of the integrity (e.g. mechanical integrity or system integrity) may be determined as a polynomial expression of said at least two magnetic field gradients or differences, for example as a second order function of these gradients or differences. It is an advantage that no goniometric function is required to calculate such second signal.

In particular embodiments, the second signal is calculated as a sum or weighted sum of the squares of the two gradient or difference signals. In other embodiments (e.g. FIG. 1), the second signal is calculated as a sum of the square of a first difference between two gradient signals, and the square of a second difference between two gradient signals.

Although not absolutely required, preferably the second signal is substantially independent of the actual position, or in other words, is substantially constant over the envisioned measurement range. This offers (inter alia) the advantage that the (e.g. mechanical) integrity can be assessed without actually calculating the position, and thus can be evaluated at a different frequency than the determination of the current position.

Optionally, the position sensor device is further adapted for comparing the second signal with one or more predefined threshold values (e.g. hardcoded in a micro-controller or stored in a non-volatile memory during production or during a calibration test), for example in order to test whether the second signal lies in a predefined range or not. The sensor device may be further configured for providing an output signal depending on the outcome of the at least one comparison, for example indicative of a "good condition" (e.g. when the signal has a value inside the predefined range between the threshold values), or an "error condition" (e.g. when the signal has a value outside of said predefined range, e.g. is larger than the upper threshold or is smaller than the lower threshold).

Figure 10:
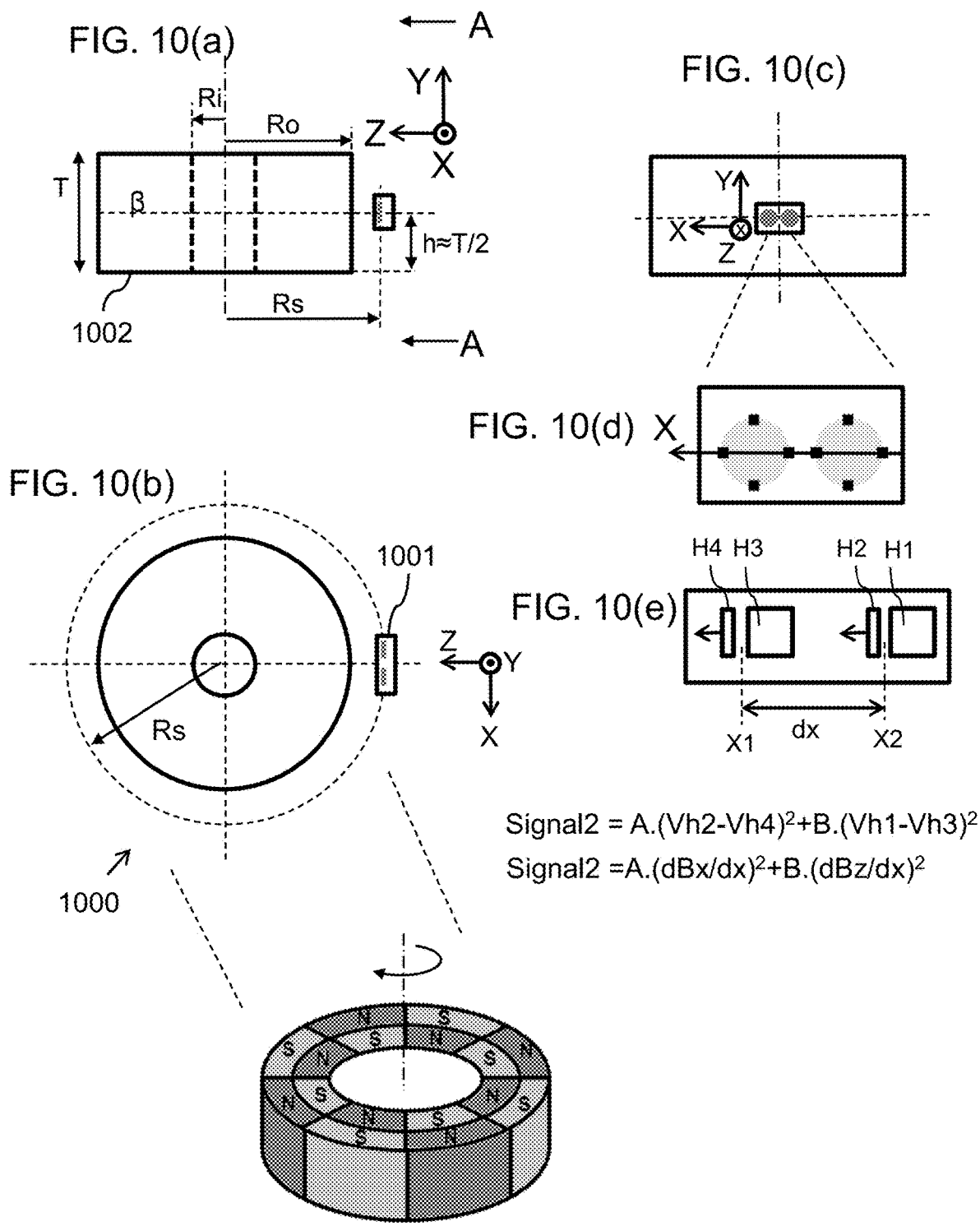
FIG. 10, including

As will become clear further, the underlying principles of the present invention are applicable for various mechanical configurations, for example:
  for angular position sensor systems (see e.g. FIG. 1-10) as well as linear position sensor systems (see e.g. FIG. 11);
  for various magnetic sources (e.g. a two-pole disk magnet or a two-pole ring magnet, or a four-pole disk magnet or a four-pole ring magnet, or a ring or disk magnet with more than four poles);
  for different topologies, e.g. for angular position sensor systems where the sensor device is mounted at various locations with respect to the magnetic source, for example in a so called "on-axis" position (see e.g. FIG. 1-4), or in a so called "off-axis position" (see e.g. FIG. 5 and FIG. 8), or "in the corner" (see e.g. FIG. 6 and FIG. 7), or "outside the magnet" also referred to herein as "near the equator" (see e.g. FIGS. 9 and 10);

for sensor devices having a substrate mounted in various orientations (e.g. parallel to the rotation axis, or perpendicular to the rotation axis);

for sensor device having various kinds of sensor elements, for example only horizontal Hall elements with IMC (e.g. FIG. 1a, FIG. 5c, FIG. 6e, FIG. 7d, FIG. 8c, FIG. 8d, FIG. 9c, FIG. 10d, FIG. 11b, FIG. 11c), only horizontal Hall elements without IMC (e.g. FIG. 4b, FIG. 4c, FIG. 14(a), FIG. 15(a), FIG. 16(a)), both horizontal Hall elements and vertical Hall elements (e.g. FIG. 6f, FIG. 8e, FIG. 10e, FIG. 11d), only vertical Hall elements (e.g. FIG. 2, FIG. 3, FIG. 5d, FIG. 5e, FIG. 7e, FIG. 9d), but other sensor elements may also be used, for example magneto-resistive elements (not shown).

Referring now to the Figures.

FIG. 1(a) shows an angular position sensor system 100. This position sensor system comprises a four pole ring magnet 102 or a four-pole disk magnet rotatable around a rotation axis, and a sensor device 101 located in a so called "on-axis" position (or more accurately stated: having a magnetic center which is located substantially on the rotation axis of the magnet), and having eight horizontal Hall elements H0 to H7 and an IMC structure (referred to herein as a "sun-structure") having a central disk surrounded by eight radially oriented IMC elements having a substantially trapezoidal shape. The sensor device has a semiconductor substrate which is oriented substantially perpendicular to the rotation axis. Such a sensor arrangement, albeit with twelve Hall elements and a "sun structure" with twelve IMC elements is known from WO2014029885A1 (FIG. 27), but the sensor device described in WO'885 only provides a position signal, not an integrity signal or a fault signal.

Referring back to FIG. 1(a) of the present invention, it can be understood that a first signal indicative of the angular position θ of the magnet 102 relative to the sensor device 101 (or vice versa) can be determined, for example in accordance with the following formula:

$$\text{signal1} = \arctan[(Vh1-Vh3+Vh5-Vh7)/(Vh0-Vh2+Vh4-Vh6)] \quad [1a]$$

where Vh0, Vh1, Vh2, etc. is the signal (e.g. voltage) obtained from Hall element H0, H1, H2, etc. This signal is highly insensitive to an external disturbance field in any direction. The mechanical position θ may then be derived from the first signal as follows:

$$\text{signal1} = 2*\theta \quad [1b]$$

The second signal indicative of a fault or of the integrity of this position system can for example be calculated in according in accordance with the following formula:

$$\text{signal2} = (Vh1-Vh3+Vh5-Vh7)^2 + (Vh0-Vh2+Vh4-Vh6)^2 \quad [1c]$$

If the mechanical mounting is all right, this signal is substantially constant, and independent of the angular position. This value can for example be predetermined during design or can for example be measured during a calibration test and stored in a volatile memory. In case of a mechanical mounting problem, for example if the magnet would no longer be present (e.g. because it was inadvertently removed due to vibrations), the measured value for signal2 would no longer be equal to the above mentioned constant value. Thus, by measuring this value, a fault of the position sensor system can be detected, or stated otherwise, the integrity of the position sensor system can be determined.

It is noted that (Vh1+Vh5) can be considered a gradient signal (or spatial derivative) of a magnetic field component Bu oriented in the U-direction along the U-axis, and can thus be written as dBu/du. Typically a gradient is calculated as a difference (not a sum) between two parallel vectors pointing in the same direction, but in FIG. 1(a) the gradient is calculated as a sum because the sensitivity of the Hall plates H1 and H5 and associated IMC elements are opposite along the U-axis.

Likewise (Vh3+Vh7) is a gradient signal, which can also be written as dBv/dv, and (Vh0+Vh4) is a gradient signal, which can also be written as dBx/dx, and (Vh2+Vh6) is a gradient signal, which can also be written as dBy/dy.

Thus, the second signal can also be written as:

$$\text{Signal2} = (dBu/du - dBv/dv)^2 + (dBx/dx - dBy/dy)^2 \quad [1d]$$

where each of the X, Y, U and V axis are parallel to the semiconductor substrate of the sensor device, and where the U-axis, Y-axis and V-axis are located at 45°, 90° and 135° respectively with respect to the X-axis, measured in anti-clockwise direction.

As can be appreciated, in formula [1a] and [1d] each of the terms of the first square and the second square has a coefficient of +1 or −1, but in practice coefficients different from +1 or −1 may also be used, for example in order to take into account sensitivity mismatch of the sensor elements and/or gain mismatch of the amplifiers (not shown). Suitable or optimal coefficients may be determined for example during a calibration test, and stored in a non-volatile memory 1321 of the sensor device (see e.g. FIG. 13).

Figure 1B:
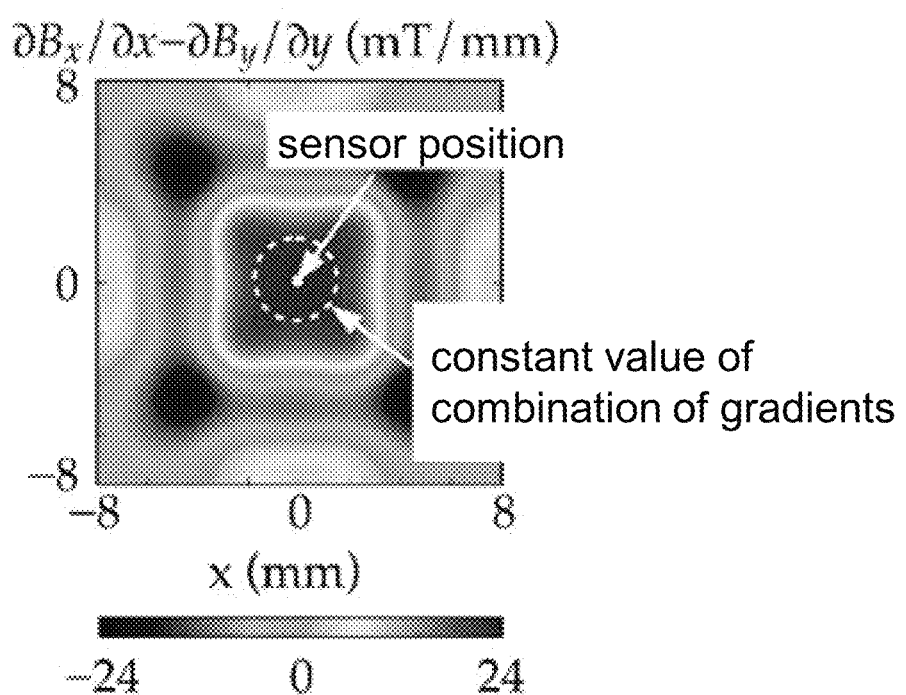
FIG. 1(b) shows a plot showing the magnitude of a difference between two gradients, in the example |dBx/dx−dBy/dy| for various locations in the vicinity of the rotation axis.

FIG. 1(b) shows a plot showing the magnitude of a difference between the two gradients dBx/dx and dBy/dy, for various locations in the vicinity of the rotation axis. As can be appreciated from the drawing, this magnitude is substantially constant within the imaginary circle, in the example of FIG. 1B having a radius of about 2 mm.

The second signal may also be determined as:

$$\text{Signal2} = (dBu/du)^2 + (dBx/dx)^2 \quad [1e]$$

where the X and U axis define an angle of 45°.

In variants of the position sensor system shown in FIG. 1, a six-pole or eight-pole magnet is used, or a magnet with more than eight poles. In this case, the sensor structure would have to be adjusted such that the number of sensor elements is twice the number of poles.

Figure 12:
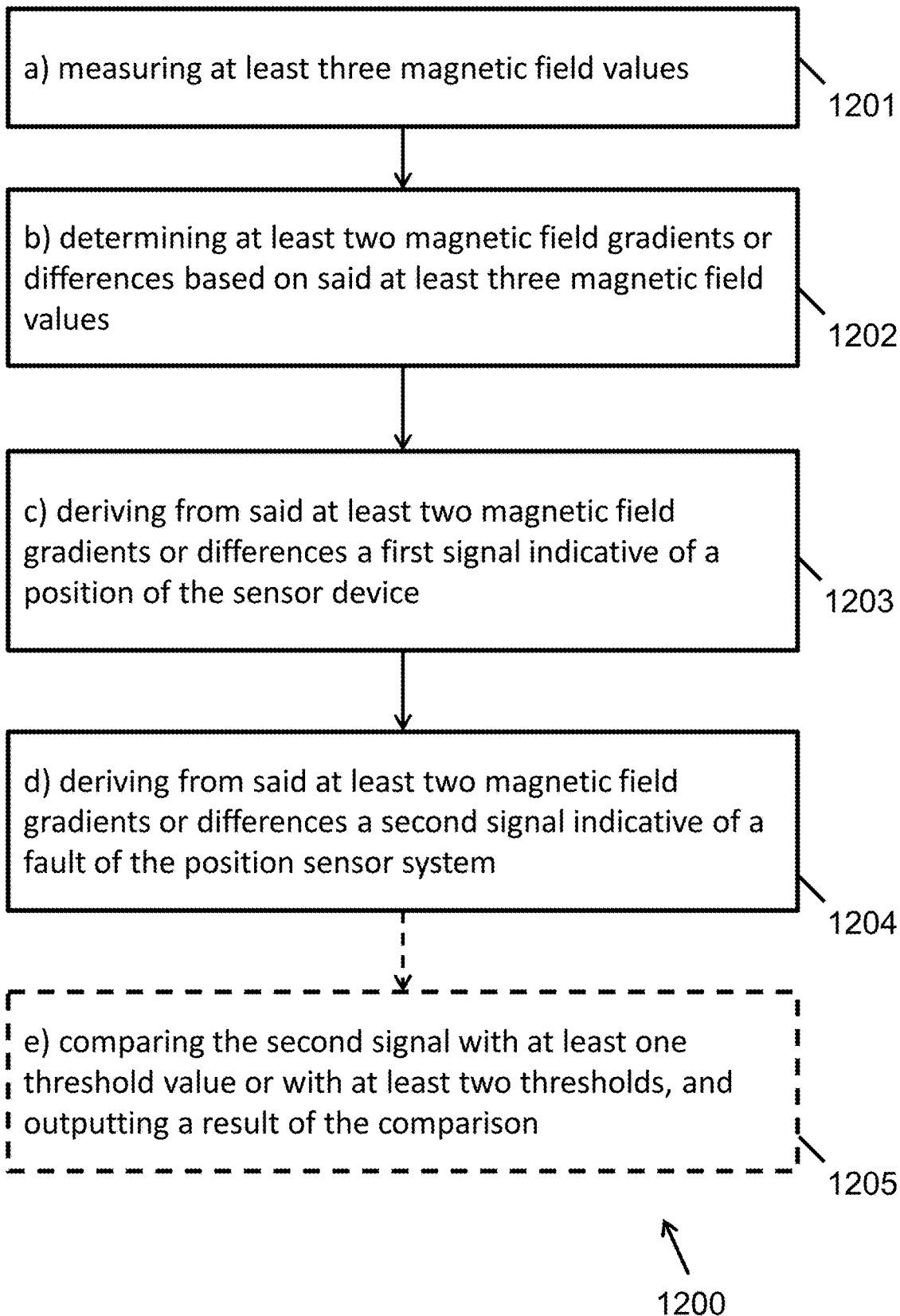
FIG. 12 illustrates a flowchart of a method of determining a first signal indicative of a position, and a second signal indicative of a fault or of the integrity of a position sensor system, wherein both the first and the second signal are insensitive to an external disturbance field.
Figure 13:
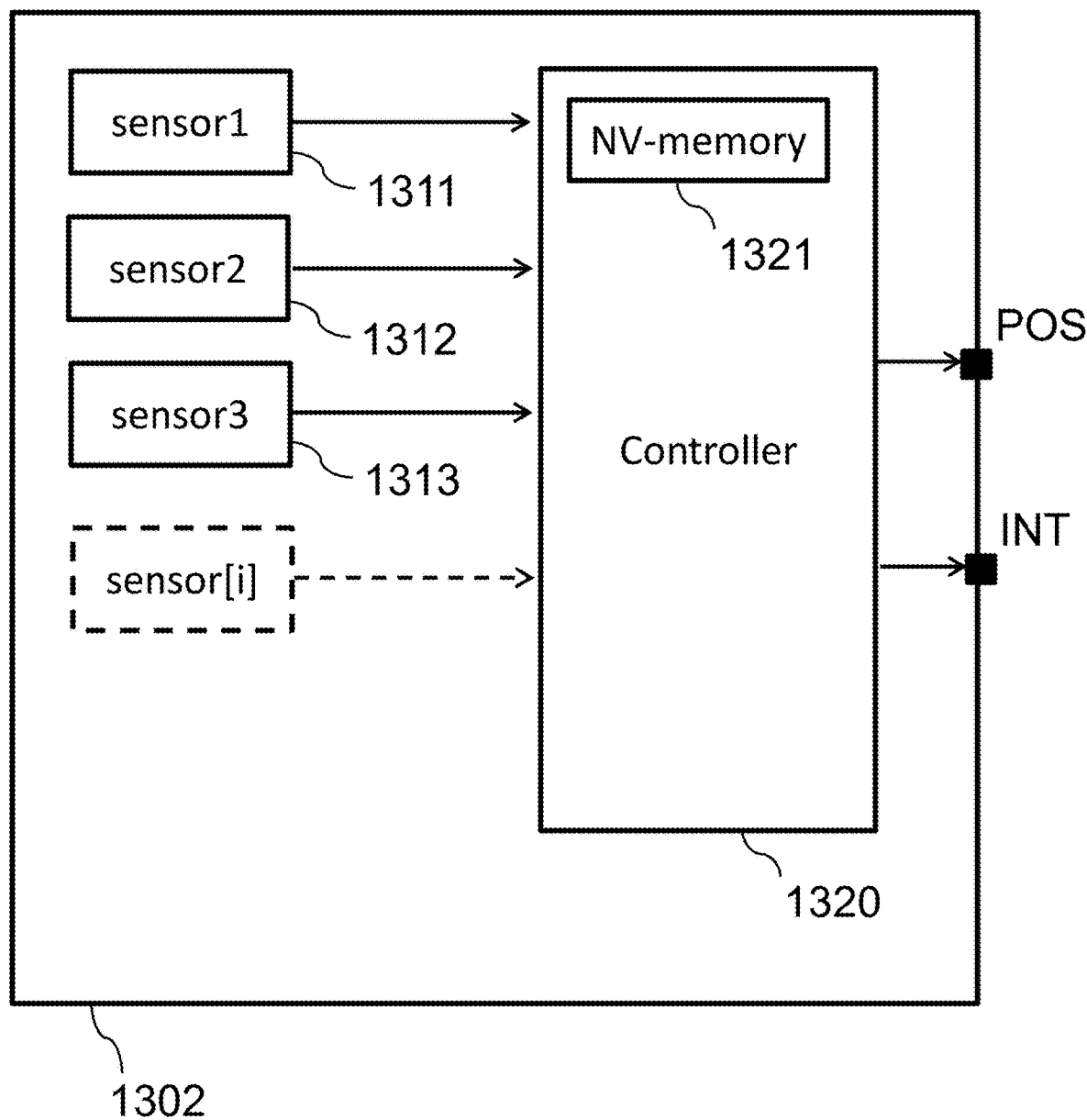
FIG. 13 is a schematic block diagram of an exemplary position sensor device according to an embodiment of the present invention.

In FIG. 12 a flow-chart of a method 1200 which is performed by sensor devices of the present invention, such as e.g. sensor device 101 of FIG. 1 will be shown, and in FIG. 13 a block-diagram of such a sensor device will be shown.

Figure 2:
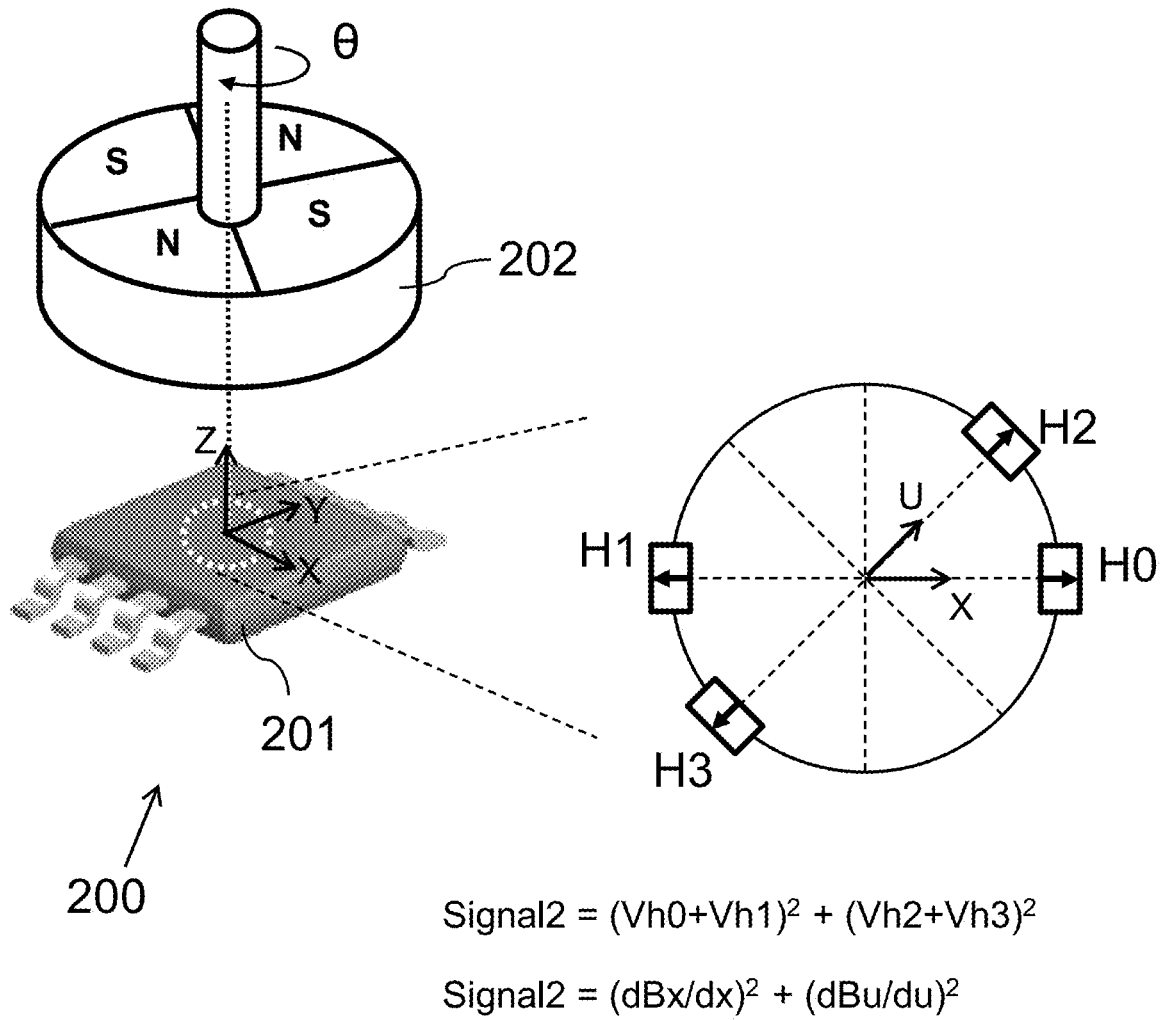
FIG. 2 shows an angular position sensor system according to another embodiment of the present invention. This position sensor system comprises a four-pole magnet rotatable around a rotation axis, and a sensor device located in an "on-axis" position and having four vertical Hall elements configured for measuring radial magnetic field components.

FIG. 2 shows an angular position sensor system 200 according to another embodiment of the present invention. This position sensor system 200 comprises a four-pole magnet 202, e.g. a radially magnetized or axially magnetized four-pole ring magnet or four-pole disk magnet) rotatable around a rotation axis, and a sensor device 201 located in an "on-axis" position (meaning: having a magnetic centre located substantially on the rotation axis). The sensor device 201 preferably comprises a semiconductor substrate and is preferably oriented such that the substrate is substantially orthogonal to the rotation axis. The sensor device has four vertical Hall elements H0 to H3 located on a virtual circle, each configured for measuring a radial magnetic field component of the magnet field generated by the magnet 202. In the example of FIG. 2 the vertical Hall elements are oriented such that their axes of maximum sensitivity are directed radially outward (as schematically indicated by the arrow), but the invention will also work if the vertical Hall elements are oriented with their axes of maximum sensitivity radially inwards, or even with some oriented radially inwards, and others radially outwards, if the values are properly added or subtracted.

In the particular example shown in FIG. 2, the angular position of the magnet can be calculated for example based on the following formula:

$$signal1 = \arctan[(Vh0+Vh1)/(Vh2+Vh3)] \quad [2a]$$

The mechanical position θ may be derived from the first signal as follows: signal1=2*θ. The first signal is insensitive to an external disturbance field. According to the present invention, a second signal is determined which is indicative of a fault or of the integrity of the sensor system, e.g. electrical integrity and/or mechanical integrity. This signal may e.g. be calculated in accordance with the following formula:

$$signal2 = (Vh0+Vh1)^2 + (Vh2+Vh3)^2 \quad [2b]$$

This can also be written as:

$$signal2 = (dBx/dx)^2 + (dBu/du)^2 \quad [2c]$$

where the X and U axis define an angle of 45°.

In a variant (not shown) of the embodiment shown in FIG. 2, the sensor device 201 has more than four vertical Hall elements, for example eight vertical Hall elements, located on the imaginary circle, oriented radially inwards or outwards, and spaced apart by 45°. In this case, the second signal may be calculated as the sum of two terms, each term being the square of a linear combination of four signals, for example a first order polynomial where each of the coefficients is +1 or −1 depending on the orientation of the vertical Hall elements (inwardly or outwardly). As described above, one or more of the coefficients may be different from +1 or −1.

Figure 3:
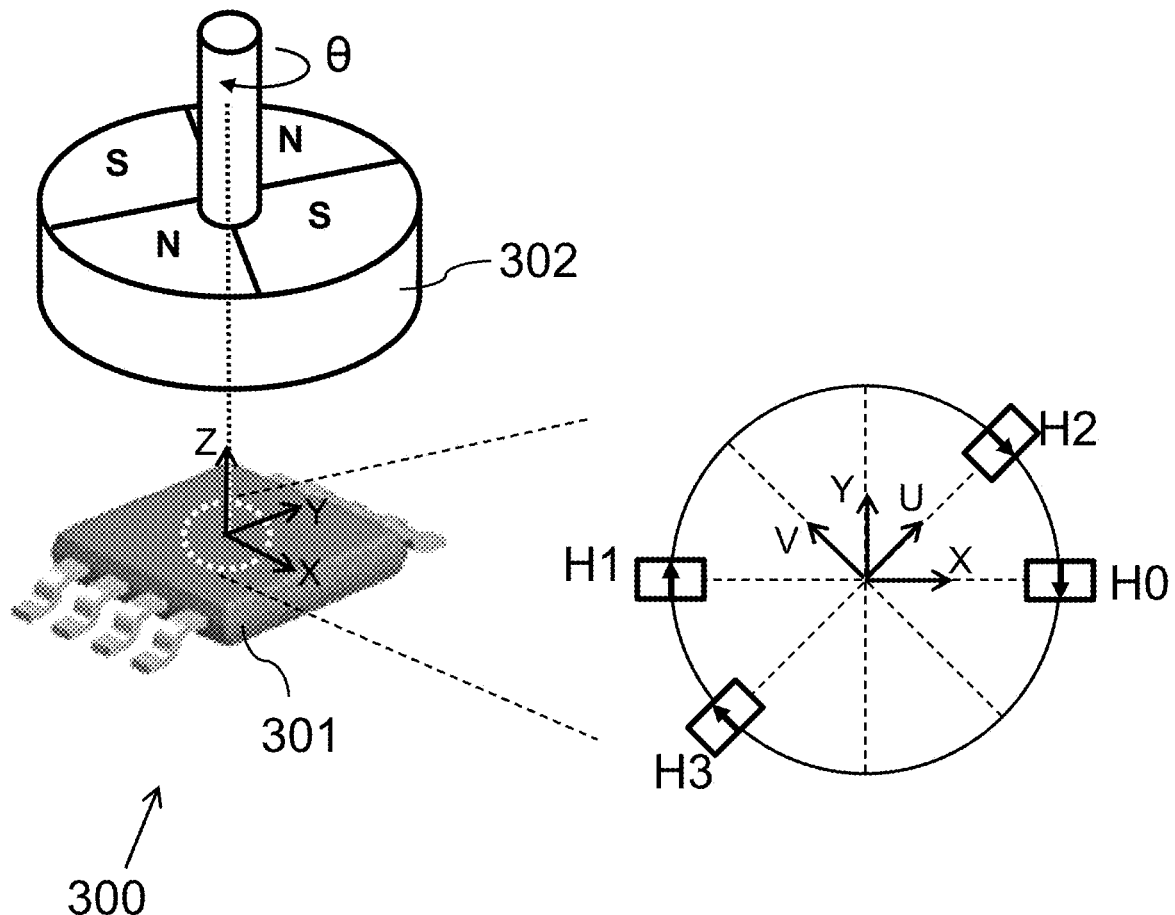
FIG. 3 shows an angular position sensor system according to another embodiment of the present invention. This position sensor system comprises a four-pole magnet rotatable around a rotation axis, and a sensor device located in an "on-axis" position and having four vertical Hall elements configured for measuring circumferential magnetic field components (i.e. field components oriented tangential to an imaginary circle having a center located on the rotation axis).

FIG. 3 shows an angular position sensor system 300 according to another embodiment of the present invention. This position sensor system 300 comprises a four-pole magnet 302, e.g. a radially or axially magnetized four-pole ring magnet or four-pole disk magnet) rotatable around a rotation axis, and a sensor device 301 located in an "on-axis" position (meaning: having a magnetic centre located substantially on the rotation axis). The sensor device 301 preferably comprises a semiconductor substrate and is preferably oriented such that the substrate is substantially orthogonal to the rotation axis. The sensor device has four vertical Hall elements H0 to H3 located on a virtual circle, and configured for measuring circumferential magnetic field components (i.e. tangential to the virtual circle) of the magnetic field generated by the magnet 302. In the example of FIG. 3 the vertical Hall elements H0 to H3 are oriented such that their axes of maximum sensitivity all point in clockwise direction, but the invention will also work if the vertical Hall elements are oriented with their axes of maximum sensitivity pointing in anti-clockwise direction, or even with some oriented in clockwise direction, and others in counter-clockwise direction, if the values are properly added or subtracted.

In the particular example shown in FIG. 3, the angular position of the magnet can be calculated for example based on the following formula:

$$signal1 = \arctan[(Vh0+Vh1)/(Vh2+Vh3)] \quad [3a]$$

The mechanical position θ may be derived from the first signal as follows: signal1=2*θ. The first signal is insensitive to an external disturbance field. According to the present invention, a second signal is determined which is indicative of a fault or of the integrity of the system, e.g. electrical integrity and/or mechanical integrity. This signal may e.g. be calculated in accordance with the following formula:

$$signal2 = (Vh0+Vh1)^2 + (Vh2+Vh3)^2 \quad [3b]$$

This can also be written as:

$$signal2 = (dBy/dx)^2 + (dBv/du)^2 \quad [3b]$$

where the X, Y, U and V-axis are parallel to the substrate, and where the U-axis, Y-axis and V-axis define an angle of 45°, 90° and 135° respectively with respect to the X-axis in counter-clockwise direction.

In a variant (not shown) of the embodiment shown in FIG. 3, the sensor device has more than four vertical Hall elements, for example eight vertical Hall elements, located on the imaginary circle, oriented such that their axes of maximum sensitivity are tangential to the imaginary circle, and pointing in clockwise or anti-clockwise direction, and spaced apart by 45°. Also in this case, the second signal may be calculated as the sum of two terms, each term being the square of a linear combination of four signals, for example a first order polynomial where each of the coefficients is +1 or −1 depending on the orientation of the vertical Hall elements (inwardly or outwardly).

FIG. 4(a) and FIG. 4(b) shows an angular position sensor system 400 according to another embodiment of the present invention. This position sensor system 400 comprises a two-pole magnet, e.g. a bar magnet, or a diametrically or axially magnetized disk magnet or ring magnet, rotatable around a rotation axis, and a sensor device 401 located in an "on-axis" position and having only three, or only four horizontal Hall elements without IMC (Integrated Magnetic Concentrator). The sensor device 401 preferably comprises a semiconductor substrate, and is preferably oriented such that the substrate is substantially orthogonal to the rotation axis, hence the horizontal Hall elements are configured for measuring magnetic field components Bz oriented substantially parallel to the rotation axis.

In the embodiment of FIG. 4(b), the sensor device 401 has four horizontal Hall elements H1 to H4, located on a circle, and angularly spaced apart by 90°.

The first signal indicative of angular position may be calculated as:

$$signal1 = \arctan[((Vh0-Vh2)/(Vh1-Vh3)] \quad [4a]$$

The mechanical position θ may be derived from the first signal as follows: signal1=θ. The first signal is insensitive to an external disturbance field. According to the present invention, a second signal is determined indicative of a fault or of the integrity of the system, e.g. electrical and/or mechanical integrity of the system. This signal may e.g. be calculated in accordance with the following formula:

$$signal2 = (Vh0-Vh2)^2 + (Vh1-Vh3)^2 \quad [4b]$$

This can also be written as:

$$signal2 = (dBz/dx)^2 + (dBz/dy)^2 \quad [4c]$$

where the X and Y axis are parallel to the substrate, and define an angle of 90°, and where the Z-axis is perpendicular to the substrate.

Figure 4C:
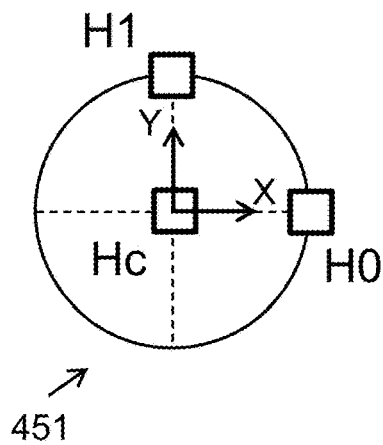
FIG. 4(c) shows an angular position sensor system according to another embodiment of the present invention, where the sensor device 415 has three horizontal Hall elements, two of which are located on a virtual circle, and one of which is located in the center of the virtual circle.

In the embodiment of FIG. 4(c), the sensor device 451 has only three horizontal Hall elements, namely one horizontal Hall element Hc located in the centre of a virtual circle, and two horizontal Hall elements H0, H1 located on the circle, and angularly spaced apart by 90°. In this embodiment, a first signal indicative for the mechanical position, may be calculated in accordance with the following formula:

$$\text{signal1} = \arctan[(Vh0 - Vhc)/(Vh1 - Vhc)] \quad [4d]$$

and the second signal, indicative of a fault or the integrity of the system (e.g. electrical and/or mechanical integrity), may be calculated as:

$$\text{signal2} = (Vh0 - Vhc)^2 + (Vh1 - Vhc)^2 \quad [4e]$$

This can also be written as:

$$\text{signal2} = (dBz/dx)^2 + (dBz/dy)^2 \quad [4f]$$

where the X and Y axis are parallel to the substrate, and define an angle of 90°, and where the Z-axis is perpendicular to the substrate.

Figure 4D:
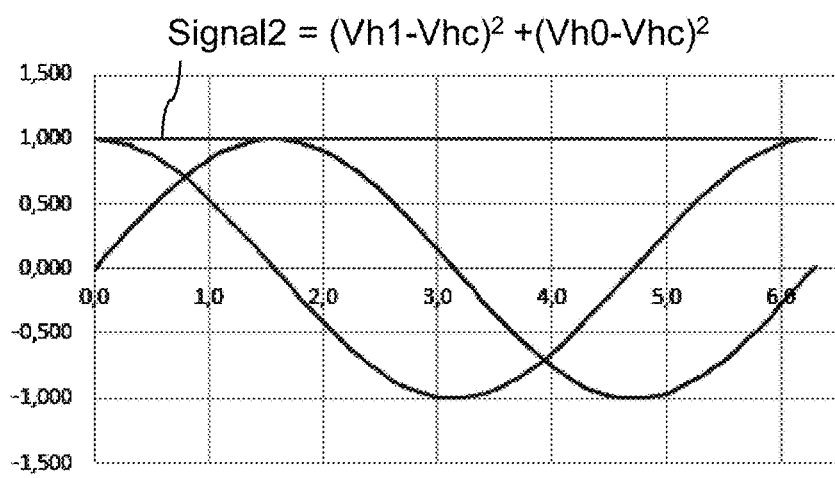
FIG. 4(d) shows simulation results of a sum of squares of differences between each of the Hall elements on the circle and the central element, as may be used in embodiments of the present invention for fault-detection.

FIG. 4(d) shows simulation results of a sum of squares of differences between each of the Hall elements H0, H1 on the circle on the one hand, and the central element Hc on the other hand, e.g. in accordance with the formula:

$$\text{Signal2} = (Vh1 - Vhc)^2 + (Vh0 - Vhc)^2$$

wherein Signal2 is the signal indicative of a fault or system integrity, and Vh0, Vh1 are the signals obtained from the two horizontal Hall elements H0, H1 located on the virtual circle, and Vhc is the signal obtained from the horizontal Hall element Hc located in the center.

Since the horizontal Hall elements H0, H1, Hc are oriented in the same (Z) direction, each of the difference signals (Vh1−Vhc) and (Vh0−Vhc) is substantially insensitive to an external disturbance field, and hence also the sum of the squares of these difference signals is highly insensitive to an external disturbance field.

In the example shown, the sum is constant over the full 360° measurement range. In practice, there may be a small variation on the signal. By calculating the sum and by comparing the sum with a first threshold smaller than said constant, and/or by comparing the sum with a second threshold larger than said constant, and by testing whether the sum is a value lower than the first threshold, and/or larger than the second threshold and/or a value between these two thresholds, it is possible to detect certain faults. In a practical implementation, an average value or median value may be determined during design and may be hardcoded, or an average value or median value may be determined during a calibration test and stored in a non-volatile memory 1321 of the sensor device 1320, which may be retrieved during actual use.

The first threshold may be a value in the range from 75% to 99% of the above-mentioned average value, e.g. equal to about 75%, or equal to about 80%, or equal to about 85%, or equal to about 90%, or equal to about 95%, or equal to about 96%, or equal to about 97%, or equal to about 98%. The second threshold may be a value in the range from 101% to 125% of the above-mentioned average value, e.g. equal to about 102%, or equal to about 103%, or equal to about 104%, or equal to about 105%, or equal to about 110%, or equal to about 115%, or equal to about 120%, or equal to about 125%.

As a numerical example, if the individual signals have an amplitude of 1.0, the difference signals would also have an amplitude of about 1.0, and the average value of the sum of squares would be equal to about 1.0. If the first threshold would be set at 85% of 1.0 (approximately 0.85), and the second threshold would be set at 115% of 1.0 (approximately 1.15), the second signal will indicate that the "system integrity is OK" if the calculated signal is a value in the range from 0.85 to 1.15 and will indicate that "a fault has occurred" if the calculated sum is a value outside this range.

Figure 4E:
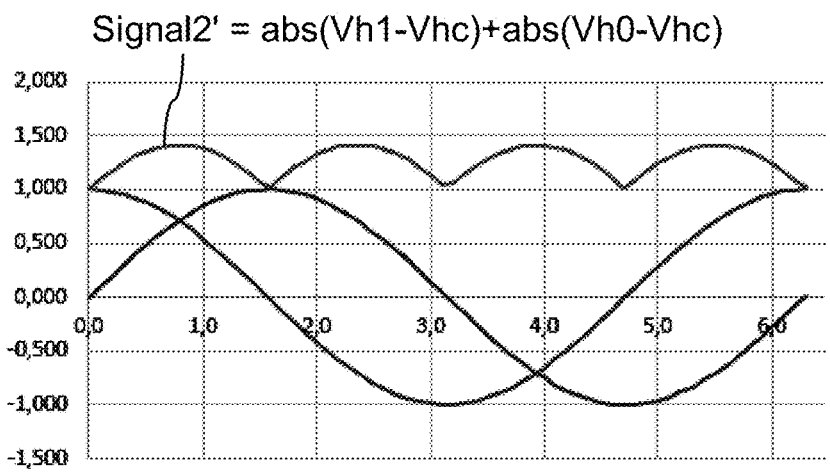
FIG. 4(e) shows simulation results of a sum of absolute values of differences between each of the Hall elements on the circle and the central element, as may be used in embodiments of the present invention for fault-detection.

FIG. 4(e) shows simulation results of another second signal Signal2' indicative of a fault, which is a variant of the formula of FIG. 4(d), wherein the second signal Signal2' is calculated as a sum of absolute values of differences between pairs of two magnetic field components, e.g. in accordance with the formula:

$$\text{Signal2'} = \text{abs}(Vh1 - Vhc)^2 + \text{abs}(Vh0 - Vhc)^2$$

where signal2' is the signal indicative of a fault or of the system integrity, Vh1, Vh0 are signals provided by the horizontal Hall elements located on the virtual circle, Vhc is the signal provided by the horizontal Hall element located in the center, or derived therefrom, e.g. after amplification, digitization, etc. Since all horizontal Hall elements are oriented in the same direction (Z, perpendicular to the plane of the semiconductor substrate), each of the difference signals (Vh1−Vhc) and (Vh0−Vhc) is substantially insensitive to an external disturbance field, and hence also the sum of the absolute values of these differences is highly insensitive to an external disturbance field.

As a numerical example, if the original signals Vh1, Vh0 have an amplitude of 1.0, the difference signals will have an amplitude of about 1.0, and the sum of the absolute values of these differences will be values in the range from about 1.00 to about 1.41. Thus, the average value is equal to about 1.20, and "valid" sums of absolute values of differences are values in the range from about 1.00 to about 1.41, which is about 1.20+/− about 18%.

In practice, taking into account typical tolerances (e.g. mechanical mounting tolerances), a slightly larger tolerance margin may be chosen, for example ±20%, or ±22%, or ±24%, or ±26%, or ±28%, or ±30%. Of course, the larger this tolerance range, the less sensitive the fault detection.

When comparing the examples of FIG. 4(d) and FIG. 4(e), it shall be clear that the sum of squares of FIG. 4(d) allows to choose a much smaller tolerance than the sum of absolute values of FIG. 4(e), but the formula of FIG. 4(d) requires the calculation of a square (thus a multiplication), which is more demanding that the calculation of an absolute value. Depending on the processor capabilities (e.g. hardware multiplier yes/no), the skilled person can choose the second signal of FIG. 4(d) or that of FIG. 4(e).

FIG. 5 shows an angular position sensor system 500 according to another embodiment of the present invention. This position sensor system 500 comprises a two-pole magnet (e.g. a diametrically magnetized ring or disk magnet) 502 rotatable around a rotation axis, and a sensor device 501 located in an "off-axis" position, (e.g. "under the ring" or "under the disk") and configured for measuring two circumferential field components (Bx) and two radial magnetic field components (By) as seen by the magnet.

The sensor device 501 preferably comprises a semiconductor substrate and is preferably oriented such that the substrate is substantially orthogonal to the rotation axis. In the embodiments shown in FIG. 5, the substrate of the sensor device is located at a predefined distance "g" (e.g. from 0.5 to 5.0 mm, e.g. equal to about 2.0 mm) from a bottom or top surface of the ring or disk magnet. The magnetic center of the sensor device is located at a distance "Rs" from the rotation axis (e.g. at least 1.4 mm, or at least 1.6 mm, or at least 1.8 mm, or at least 2.0 mm, or at least 2.5 mm, or at least 3.0 mm from the rotation axis). In the example of FIG. 5, the magnet 502 is a ring magnet with an inner radius Ri and an outer radius Ro, and Rs is preferably a value between the inner radius Ri and the outer radius Ro.

If an orthogonal coordinate system XYZ is connected to the sensor device, such that the X-axis is tangential to a circumferential direction, and the Z-axis is parallel to the rotation axis, and the Y-axis is oriented radially (i.e. perpendicular to the rotation axis) then the first signal, indicative of the angular position of the magnet relative to the sensor device, or vice versa, may be calculated as follows:

$$\text{signal1} = \arctan[K \cdot (dBx/dx)/(dBy/dx)] \quad [5a]$$

where K is a constant, which may be chosen such that the amplitude of $K^*(dBx/dx)$ is substantially equal to the amplitude of $(dBy/dx)$.

FIG. 5(c) to FIG. 5(d) show various sensor structures which may be used to calculate these gradients. The sensor device of FIG. 5(c) uses a so called "dual disk" structure comprising horizontal Hall elements and IMC. More information about this structure can be found in US2018372475, incorporated herein by reference in its entirety. Such disks may for example have a diameter of about 150 to about 250 micron, hence the distance between two corresponding Hall elements may be in the order of about 200 micron. The distance between the centres of the two disks may be in the order of 1.5 mm to 2.5 mm, e.g. equal to about 2.0 mm. The sensor device of FIG. 5(d) comprises two pairs of vertical Hall elements, spaced apart by a distance "dx" along the X-axis. Using the latter sensor structure, the value of dBx/dx can be calculated as (H2−H4), and the value of dBy/dx can be calculated as (H1−H3). But other sensor structures may also be used. The second signal, indicative of a fault or of the integrity of the system of FIG. 5, may be calculated as:

$$\text{signal2} = A \cdot (dBx/dx)^2 + B(dBy/dx)^2 \quad [5b]$$

where A and B are constants. The values of A and B may be dependent on the mounting position (Rs and/or g). The value of A and B are preferably chosen such that the second signal is substantially constant for all angular positions. In preferred embodiment, the ratio of A/B is substantially equal to $K^2$. In a particular embodiment, the value of B is chosen equal to 1, and the value of A is chosen equal to $K^2$.

FIG. 6 shows an angular position sensor system 600 according to another embodiment of the present invention, which can be seen as a variant of the position sensor system 500 of FIG. 5.

The angular position sensor system 600 of FIG. 6 comprises a two-pole magnet 602 (e.g. a diametrically magnetized two-pole ring magnet or disk magnet) rotatable around a rotation axis, and a sensor device 601 located near a so called "corner position" (e.g. near the periphery of the outer circle of the bottom or top surface of the ring or disk magnet). The ring of disk magnet has an outer radius Ro.

The sensor device 601 preferably comprises a semiconductor substrate and is preferably oriented such that the substrate is substantially orthogonal to the rotation axis. In the embodiments shown in FIG. 6, the substrate of the sensor device is located in a plane at a predefined distance "g" (e.g. from 0.5 to 5.0 mm, e.g. equal to about 2.0 mm) from a bottom or top surface of the ring or disk magnet, and the substrate is substantially perpendicular to the rotation axis. The magnetic center of the sensor device 601 is located at a distance "Rs" from the rotation axis, which may be a value in the range from about 80% to 120% of Ro, or in the range from about 90% to 110% of Ro.

The sensor device 601 of FIG. 6 is configured for measuring a circumferential field component (Bx1, Bx2) and an axial field component (Bz1, Bz2) at two different locations X1, X2 along the X-axis. If an orthogonal coordinate system XYZ is connected to the sensor device, such that the X-axis is tangential to a circumferential direction, the Z-axis is perpendicular to the substrate and parallel to the rotation axis, and the Y-axis is parallel to the substrate and orthogonally intersecting the rotation axis, then the first signal, indicative of the angular position of the magnet relative to the sensor device (or vice versa) may be calculated as follows:

$$\text{signal1} = \arctan[K^*(dBx/dx)/(dBz/dx)] \quad [6a]$$

where K is a constant value, which may be chosen such that the magnitude of $K^*(dBx/dx)$ is substantially equal to magnitude of $(dBz/dx)$.

FIG. 6(e) and FIG. 6(f) show various sensor structures which may be used to calculate these gradients. The sensor device of FIG. 6(e) uses a so called "dual disk" structure comprising horizontal Hall elements and IMC. As mentioned above, more information about this structure can be found in US2018372475. The sensor device of FIG. 6(f) comprises two horizontal Hall elements and two vertical Hall elements, spaced apart by distance "dx" along the X-axis. Using the latter sensor structure, the value of dBx/dx can be calculated as (Vh2-Vh4), and the value of dBz/dx can be calculated as (Vh1-Vh3). But other sensor structures may also be used. The second signal, indicative of a fault or of the integrity (e.g. (electrical and/or mechanical integrity) of the position sensor system of FIG. 6, may be calculated as:

$$\text{signal2} = A \cdot (dBx/dx)^2 + B(dBz/dx)^2 \quad [6b]$$

where A and B are constants. The values of A and B may be dependent on Rs and/or g. The value of A and B are preferably chosen such that the second signal is substantially constant for all angular positions. In preferred embodiment, the ratio of A/B is substantially equal to $K^2$. In a particular embodiment, the value of B is chosen equal to 1, and the value of A is chosen equal to $K^2$. The value(s) of A, B, K may be predefined, e.g. determined during design and e.g. hardcoded, or may be determined during a calibration test, and stored in a non-volatile memory of the sensor device.

FIG. 7 shows an angular position sensor system 700 according to another embodiment of the present invention, which can be seen as a variant of the sensor system 600 of FIG. 6.

The angular position sensor system 700 of FIG. 7 comprises a two-pole magnet 702 (e.g. a diametrically magnetized two-pole ring magnet or disk magnet) rotatable around a rotation axis, and a sensor device 701 located near a so called "corner position" (e.g. near the periphery of the outer circle of the bottom or top surface of the ring or disk magnet). The ring of disk magnet has an outer radius Ro.

The sensor device 801 preferably comprises a semiconductor substrate and is preferably oriented such that the substrate is substantially parallel to the rotation axis. In the embodiments shown in FIG. 7, the substrate of the sensor device is substantially located at a predefined distance "g" (e.g. from 0.5 to 5.0 mm, e.g. equal to about 2.0 mm) from a bottom or top surface of the ring or disk magnet. The magnetic center of the sensor device 701 is located at a distance "Rs" from the rotation axis, which may be a value in the range from about 80% to 120% of Ro, or in the range from about 90% to 110% of Ro.

The sensor device 701 of FIG. 7 is configured for measuring a circumferential field component (Bx1, Bx2) and an axial field component (Bz1, Bz2) at two different locations X1, X2 along the X-axis. If an orthogonal coordinate system XYZ is connected to the sensor device 701, such that the X-axis is tangential to a circumferential direction, the Y-axis is parallel to the substrate and parallel to the rotation axis, and the Z-axis is perpendicular to the substrate and orthogonally intersecting the rotation axis then the first signal, indicative of the angular position of the magnet relative to the sensor device (or vice versa) may be calculated as follows:

$$signal1=\arctan[K*(dBx/dx)/(dBy/dx)] \quad [7a]$$

where K is a constant value, which may be chosen such that the magnitude of K*(dBx/dx) is substantially equal to magnitude of (dBy/dx).

FIG. 7(d) and FIG. 7(e) show various sensor structures which may be used to calculate these gradients. The sensor device of FIG. 7(d) uses a so called "dual disk" structure comprising horizontal Hall elements and IMC. This may the same dual disk structure as that of FIG. 6(e), but the signals may be combined differently. As mentioned above, more information about this structure can be found in US2018372475. The sensor device of FIG. 7(e) comprises four vertical Hall elements H1 to H4, two (H2, H4) with their axis of maximum sensitivity oriented in the X-direction, and two (H1, H3) with their axis of maximum sensitivity oriented in the Y-direction, spaced apart by distance "dx" along the X-axis. Using the latter sensor structure, the value of dBx/dx can be calculated as (Vh2−Vh4), and the value of dBy/dx can be calculated as (Vh1−Vh3). But other sensor structures may also be used. The second signal, indicative of a fault or of the integrity of the system of FIG. 7, may be calculated as:

$$signal2=A\cdot(dBx/dx)^2+B(dBy/dx)^2 \quad [7b]$$

where A and B are constants. The values of A and B may be dependent on the mounting position (e.g. on Rs and/or g). The value of A and B are preferably chosen such that the second signal is substantially constant for all angular positions. In preferred embodiment, the ratio of A/B is substantially equal to $K^2$. In a particular embodiment, the value of B is chosen equal to 1, and the value of A is chosen equal to $K^2$. The value(s) of A, B, K may be predefined, e.g. determined during design and e.g. hardcoded, or may be determined during a calibration test, and stored in a non-volatile memory of the sensor device.

It is pointed out that the arrangement of FIG. 7 also works with a four-pole ring or disk magnet, or with a magnet with more than four poles.

FIG. 8 shows an angular position sensor system 800 according to another embodiment of the present invention. The angular position sensor system 800 comprises a four-pole magnet 802 (e.g. an axially magnetized ring magnet, or an axially magnetized disk magnet) rotatable around a rotation axis, and a sensor device 801 located in a so called "off-axis" position (e.g. at a distance of about 0.5 to 5.0 mm above the top surface or below the bottom surface of the magnet), at a distance Rs from the rotation axis. If the magnet is a ring magnet having an inner radius Ri and an outer radius Ro, Rs is preferably a value between Ri and Ro, for example substantially halfway between Ri and Ro.

The sensor device 801 is configured for measuring two circumferential (Bx) and two axial (By) magnetic field components with respect to the magnet. The sensor device 801 has a substrate oriented substantially perpendicular to the rotation axis, in the example of FIG. 8, located at a distance "g" from the bottom surface of the magnet 802.

If an orthogonal coordinate system X,Y,Z is attached to the sensor device such that the axes X,Y are parallel to the substrate, and the Z-axis is perpendicular to the substrate, and the X-axis is tangential to an imaginary circle with radius "Rs", and the Z-axis is parallel to the rotation axis, and the Y-axis is oriented radially, then the first signal, indicative of the angular position may be written as:

$$signal1=\arctan[K*(dBx/dx)/(dBz/dx)] \quad [8a]$$

where K is a constant value, which may be chosen such that the magnitude of K times the gradient (dBx/dx) is substantially equal to magnitude of the gradient (dBz/dx).

And the second signal, indicative of a fault or of the integrity of the position sensor system 800 may be calculated as:

$$signal2=A\cdot(dBx/dx)^2+B(dBz/dx)^2 \quad [8b]$$

where A and B are constants. The values of A and B may be dependent on the mounting position (e.g. on Rs and/or g). The value of A and B are preferably chosen such that the second signal is substantially constant for all angular positions. In preferred embodiment, the ratio of A/B is substantially equal to $K^2$. In a particular embodiment, the value of B is chosen equal to 1, and the value of A is chosen equal to $K^2$. The value(s) of A, B, K may be predefined, e.g. determined during design and e.g. hardcoded, or may be determined during a calibration test, and stored in a non-volatile memory of the sensor device.

FIG. 8(c) and FIG. 8(d) show a few examples of sensor structures which may be used to measure said magnetic field components and to determine said gradients, but the present invention is not limited thereto, and other suitable sensor structures may also be used. FIG. 8c shows a "dual disk structure" with four horizontal Hall elements and two IMC disks. As mentioned above, the disks may have a diameter of about 200 micron, and may be spaced apart by about 2.0 mm. FIG. 8(d) shows a sensor structure with two horizontal Hall elements and two vertical Hall elements, spaced apart by a predefined distance "dx", e.g. in the range from about 1.0 mm to about 3.0 mm, but other suitable distances may also be used.

In a variant, the magnet 802 may comprise more than four poles, e.g. six poles or eight poles, or more than eight poles.

FIG. 9 shows an angular position sensor system 900 according to another embodiment of the present invention. The position sensor system 900 comprises a multi-pole magnet 902 (e.g. a radially magnetized ring magnet having at least four, or at least six, or at least eight pole, or more than eight pole pairs) rotatable around a rotation axis, and a sensor device 901.

The sensor device 901 is located at a distance "Rs" from the rotation axis, Rs being larger than the outer radius Ro of the magnet. The sensor device 901 is configured for measuring a circumferential magnetic field component Bx (tangential to an imaginary circle with radius Rs) and a radial magnetic field component By (with respect to the magnet) at two locations X1, X2 spaced apart along the X-axis, and has a substrate oriented substantially perpendicular to the rotation axis, and located in a plane β perpendicular to the rotation axis, and substantially midway between the top and bottom plane of the magnet. If the magnet has a thickness T, then the substrate is preferably located at a distance T/2 from the bottom plane and top plane.

If an orthogonal coordinate system X,Y,Z is attached to the sensor device such that the axes X,Y are parallel to the substrate, and the Z-axis is perpendicular to the substrate, and the X-axis is tangential to an imaginary circle with radius "Rs", and the Z-axis is parallel to the rotation axis, and the Y-axis is oriented radially, then the first signal, indicative of the angular position may be written as:

$$\text{signal1} = \arctan[K^*(dBx/dx)/(dBy/dx)] \quad [9a]$$

where K is a constant value, which may be chosen such that the magnitude of K times the gradient (dBx/dx) is substantially equal to magnitude of the gradient (dBy/dx).

And the second signal, indicative of a fault or of the integrity (e.g. electrical an/or mechanical integrity) of the position sensor system may be calculated as:

$$\text{signal2} = A \cdot (dBx/dx)^2 + B(dBy/dx)^2 \quad [9b]$$

where A and B are constants. The values of A and B may be dependent on Rs and/or h. The value of A and B are preferably chosen such that the second signal is substantially constant for all angular positions. In preferred embodiment, the ratio of A/B is substantially equal to $K^2$. In a particular embodiment, the value of B is chosen equal to 1, and the value of A is chosen equal to $K^2$. The value(s) of A, B, K may be predefined, e.g. determined during design and e.g. hardcoded, or may be determined during a calibration test, and stored in a non-volatile memory of the sensor device.

FIG. 9(c) and FIG. 9(d) show a few examples of sensor structures which may be used to measure said magnetic field components and to determine said gradients, but the present invention is not limited thereto, and other suitable sensor structures may also be used. FIG. 9(c) shows a so called "dual disk structure" with eight horizontal Hall elements and two IMC disks. FIG. 9(d) shows a sensor structure with four vertical Hall elements. But other suitable sensor structures may also be used.

In a variant, the magnet 902 may comprise less than eight pole pairs, e.g. four pole pairs or six pole pairs, or more than eight pole pairs, e.g. ten of twelve pole pairs.

FIG. 10 shows an angular position sensor system 1000 according to another embodiment of the present invention, which can be seen as a variant of FIG. 9, the main differences being:
- that the substrate of the sensor device 1001 is parallel to the rotation axis of the magnet,
- the Z-axis (perpendicular to the substrate) is oriented radially with respect to the magnet, the Y-axis is parallel to the rotation axis,
- the sensor structure of the sensor device 1001 is configured for measuring a gradient of the circumferential field component (tangential to an imaginary circle with radius Rs) and a gradient of the radial field component with respect to the rotation axis, but these gradients are calculated differently by the sensor device.

FIG. 10(a) shows a front view, FIG. 10(b) shows a top view. FIG. 10(c) shows a side view.

FIG. 10(d) shows that the sensor device may comprise a "dual disk" structure.

FIG. 10(e) shows that the sensor device may comprise two vertical Hall elements and two horizontal Hall elements, spaced apart in the X-direction, tangential to an imaginary circle with radius "Rs". The radius Rs is larger than the outer radius Ro.

If an orthogonal coordinate system X,Y,Z is attached to the sensor device such that the axes X,Y are parallel to the substrate, and the Z-axis is perpendicular to the substrate, and the X-axis is tangential to an imaginary circle with radius "Rs", and the Y-axis is parallel to the rotation axis, and the Z-axis is perpendicular to the rotation axis, then the first signal, indicative of the angular position may be written as:

$$\text{signal1} = \arctan[K^*(dBx/dx)/(dBz/dx)] \quad [10a]$$

where K is a constant value, which may be chosen such that the magnitude of K times the gradient (dBx/dx) is substantially equal to magnitude of the gradient (dBz/dx).

And the second signal, indicative of a fault or of the integrity (e.g. electrical and/or mechanical integrity) of the position sensor system may be calculated as:

$$\text{signal2} = A \cdot (dBx/dx)^2 + B(dBz/dx)^2 \quad [10b]$$

where A and B are constants. The values of A and B may be dependent on Rs and/or h. The value of A and B are preferably chosen such that the second signal is substantially constant for all angular positions. In preferred embodiment, the ratio of A/B is substantially equal to $K^2$. In a particular embodiment, the value of B is chosen equal to 1, and the value of A is chosen equal to $K^2$. The value(s) of A, B, K may be predefined, e.g. determined during design and e.g. hardcoded, or may be determined during a calibration test, and stored in a non-volatile memory of the sensor device.

FIG. 10(d) and FIG. 10(e) show a few examples of sensor structures which may be used to measure said magnetic field components and to determine said gradients, but the present invention is not limited thereto, and other suitable sensor structures may also be used. FIG. 10(d) shows a so called "dual disk structure" with eight horizontal Hall elements and two IMC disks. FIG. 10(e) shows a sensor structure with two vertical Hall elements and two horizontal Hall elements. But other suitable sensor structures may also be used. The reader can find more details about the "dual disk structure" and how this can be used to determine magnetic field gradients, in US2018372475A1, which is incorporated herein by reference in its entirety.

Figure 11:
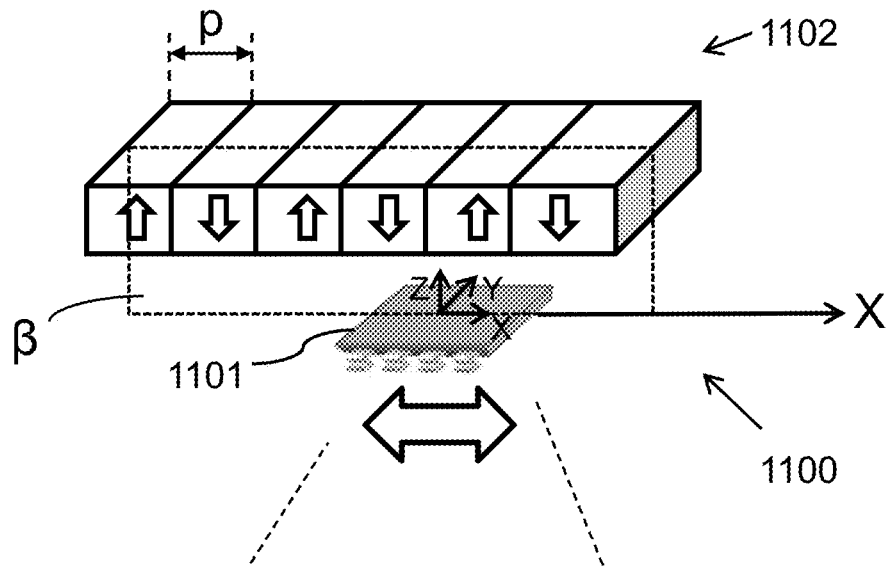
FIG. 11, including
Figure 11:
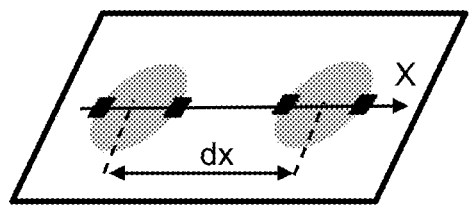
Figure 11:
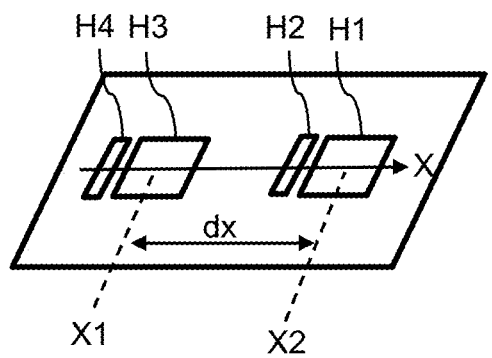

FIG. 11 shows a linear position sensor system 1100 according to another embodiment of the present invention. The position sensor system 1100 comprises a multi-pole magnetic structure 1102 having an elongated shape extending in a first direction X and having a plurality of magnetic poles magnetised in a second direction Z substantially perpendicular to the first direction X, and a sensor device 1101 configured for measuring two magnetic field components Bx oriented in the first direction X and configured for measuring two magnetic field components Bz oriented in the second direction Z, at two different locations X1, X2 spaced apart in the first direction X, and for calculating a first and second gradient dBx/dx and dBz/dx based on these field components.

If an orthogonal coordinate system X,Y,Z is connected to the sensor device, as shown in FIG. 11, the first signal, indicative of an angular position, may be calculated in accordance with the following formula:

$$\text{signal1} = \arctan[K^*(dBx/dx)/(dBz/dx)] \quad [11a]$$

where K is a constant value, which may be chosen such that the magnitude of K times the gradient (dBx/dx) is substantially equal to the magnitude of the gradient (dBz/dx). This angular position can be converted into a linear position in known manners (e.g. by multiplying the angular position with a constant, e.g. corresponding to 2*p/360°, and by taking into account the number of poles from a start position, or in any other way), and the second signal, indicative of a fault or of the integrity (e.g. electrical and/or mechanical integrity) of the linear position sensor system 1100 may be calculated in accordance with the following formula:

$$\text{signal2} = A \cdot (dBx/dx)^2 + B \cdot (dBz/dx)^2 \qquad [11b]$$

FIG. 11(b) and FIG. 11(c) show several sensor structures which can be used to determine said gradients. The sensor structure of FIG. 11(b) comprises a so called "dual disk structure" with four Horizontal Hall plates and two IMC disks (in which, simply stated, the Bx component can be determined by subtracting the signals obtained from two corresponding Hall elements located at opposite sides of the same disk, and the Bz component can be determined by adding the signals obtained from these two Hall elements). The sensor structure of FIG. 11(c) comprises two horizontal Hall plates H1, H3 configured for measuring Bz at X1 and X2 spaced apart along the X-axis, and two vertical Hall plates H2, H4 configured for measuring Bx at X1 and X2.

In preferred embodiments, dx is smaller than p/4 or smaller than p/6, or smaller than p/8 or smaller than p/10, or smaller than p/12, p being the distance between centers of adjacent poles. But the invention is not limited hereto, and other values of dx relative to p may also be used.

FIG. 12 illustrates a flowchart of a method 1200 of determining a first signal (or first value) indicative of a position, and a second signal (or second value) indicative of a fault or of the integrity (e.g. electrical and/or mechanical integrity) of a position sensor system, the system comprising a magnetic source and a sensor device movably mounted relative to the magnetic source, or vice versa, wherein both the first and the second signal are insensitive to an external disturbance field. The method 1200 comprises the steps of:

a) measuring 1201 at least three magnetic field values (e.g. Vh0, Vhc, Vh1 in FIG. 4(c); or Vh1 to Vh4 in FIG. 5 to FIG. 10) of the magnetic field generated by the magnetic source;

b) determining 1202 at least two magnetic field gradients (e.g. dBu/du and dBx/dx in FIGS. 1, 2; or dBz/dx and dBz/dy in FIG. 4; or dBx/dx and dBy/dx in FIGS. 5, 7, 9; or dBx/dx and dBz/dx in FIGS. 6, 8, 10) or at least two or at least three magnetic field differences (see e.g. FIG. 14(a) to FIG. 16(d)) based on said at least three magnetic field values;

c) deriving 1203 from said at least two magnetic field gradients or from said at least two or at least three magnetic field differences a first signal or a first value "signal1" indicative of a (e.g. linear or angular) position of the sensor device;

d) deriving 1204 from said at least two magnetic field gradients or from said at least two or at least three magnetic field differences a second signal "signal2" indicative of a fault or of the integrity (e.g. electrical and/or mechanical integrity) of the position sensor system, e.g. indicative of the presence or absence of the magnetic source.

Step a) may comprise: measuring three magnetic field values oriented in a single direction at three different locations, or measuring two magnetic field values at a first location and measuring two magnetic field values at a second location different from the first location).

Step b) may comprise: measuring said spatial gradients along a direction of relative movement, for example in case of an angular position sensor system, in a circumferential direction, or in a direction tangential to an imaginary circle having a center located on the rotation axis.

Figure 14A:
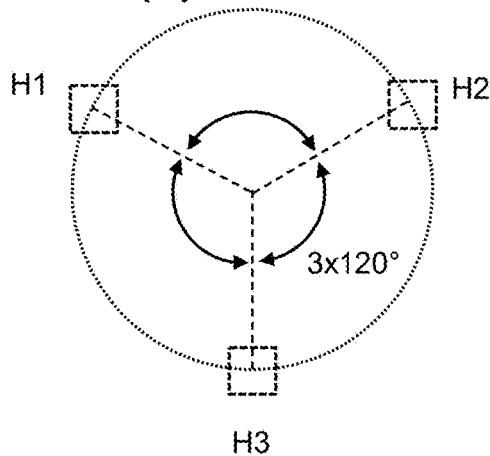
FIG. 14(a) and FIG. 14(b) show another sensor system according to an embodiment of the present invention, comprising a two-pole magnet and a sensor device comprising three horizontal Hall elements located on a virtual circle and angularly spaced apart by multiples of 120°.
Figure 14B:
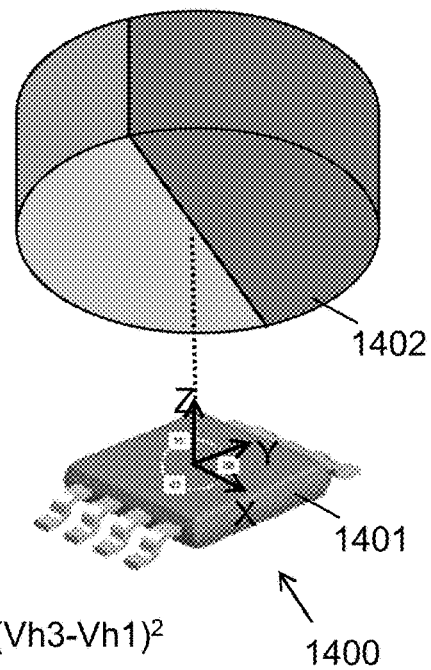
Figure 14C:
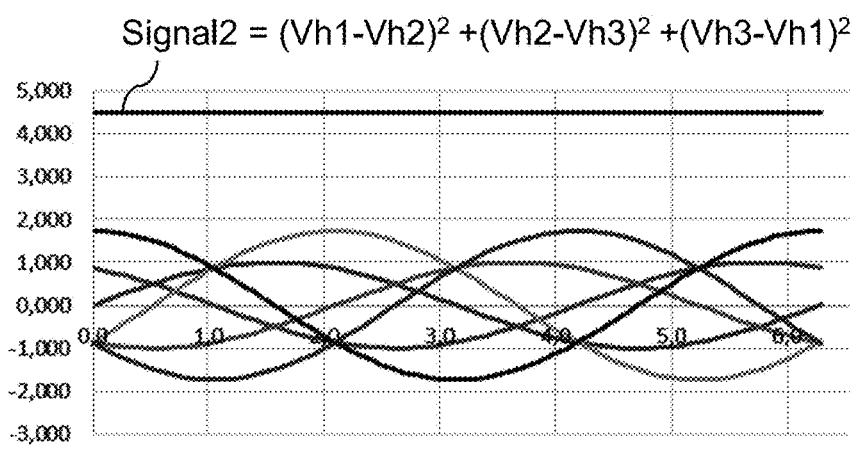
FIG. 14(c) shows simulation results of a sum of squares of differences between pairs of two magnetic field components.
Figure 14D:
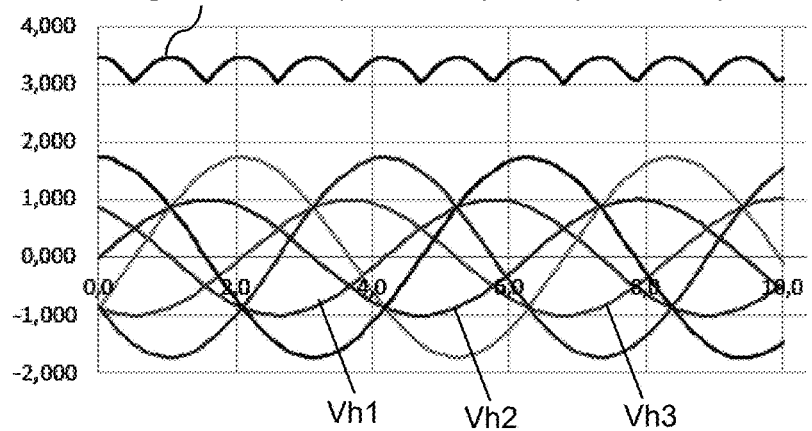
FIG. 14(d) shows simulation results of a sum of absolute values of differences between pairs of two magnetic field components.

In an embodiment, step b) may comprise: determining differences between signals obtained from various horizontal Hall elements located on a virtual circle, as illustrated for example in FIG. 14(c) or FIG. 14(d).

Figure 15A:
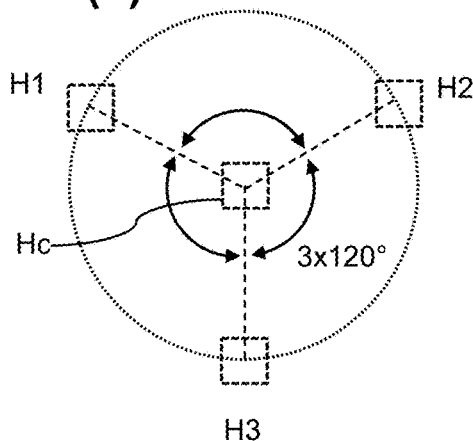
FIG. 15(a) and FIG. 15(b) show another sensor system comprising a two-pole magnet and a sensor device comprising three horizontal Hall elements located on a virtual circle and angularly spaced apart by multiples of 120°, and a fourth horizontal Hall element located in the center of the circle.
Figure 15B:
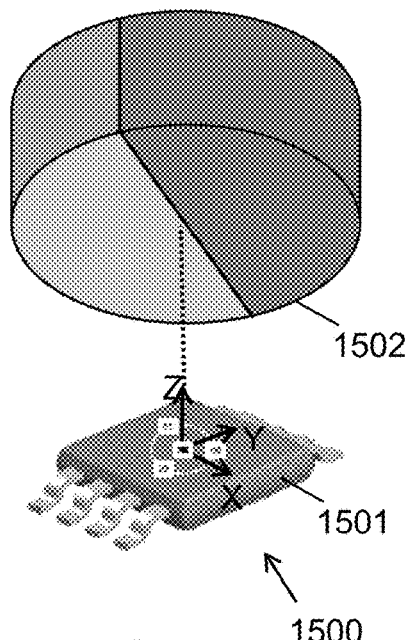
Figure 15C:
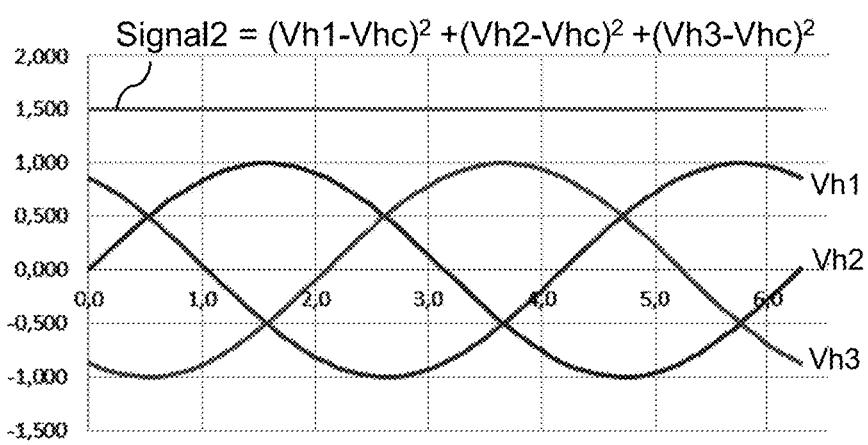
FIG. 15(c) shows simulation results of a sum of squares of differences between each of the Hall elements on the circle and the central element.
Figure 15D:
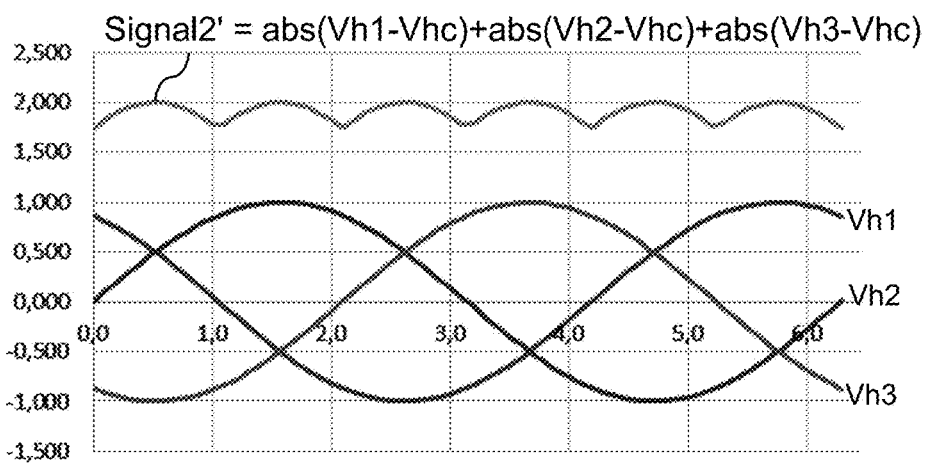
FIG. 15(d) shows simulation results of a sum of absolute values of differences between each of the Hall elements on the circle and the central element.

In an embodiment, step b) may comprise: determining differences between signals obtained from horizontal Hall elements located on a virtual circle and a signal obtained from a horizontal Hall element located in a center of the circle, as illustrated for example in FIG. 15(c) or FIG. 15(d).

In an embodiment, step b) may comprise: calculating an average signal of the signals obtained from horizontal Hall elements located on a circle, and calculating differences between signals obtained from the horizontal Hall elements located on the virtual circle and the average signal, as illustrated or example in FIG. 16(c) or FIG. 16(d).

Step c) may further comprise: converting the first signal into an angular position, e.g. in accordance with the formula: signal1=N*θ, where N is an integer number and θ is the mechanical angle. The value of N is typically equal to 1 for a two-pole magnet, and is typically equal to 2 for a four-pole magnet.

In case of a linear position sensor, step c) may further comprise converting the angular position value into a linear position value, for example by taking into account the number of the pole under which the sensor device is located.

The method may optionally further comprise step e) of:

e) comparing 1205 the second signal with at least one threshold value, and outputting a result of the comparison, for example in the form of a low or high voltage level, corresponding to a "good" or bad system integrity. It is also possible to compare the second signal with more than one threshold value, e.g. with a lower threshold value and with an upper threshold value, and to output a result of the comparison in the form of a "good-signal", a "warning-signal", or an "error-signal". The skilled person having the benefit of the present disclosure can easily think of other variants.

FIG. 13 is a schematic block diagram of an exemplary position sensor device 1302 as can be used in embodiments of the present invention. Position sensor devices are known in the art, but a brief description is provided for completeness.

The position sensor device 1302 of FIG. 13 comprises a plurality of magnetic sensitive elements (e.g. in the example of FIG. 1 eight horizontal Hall elements H0 to H7; in the example of FIG. 2 four vertical Hall elements; etc.), arranged in a particular manner on a semiconductor substrate as described above (e.g. in FIG. 1 to FIG. 11)

The position sensor device 1302 further comprises a processor or a processing circuit, for example a programmable processing unit 1320 adapted for determining a first and a second gradient signal based on the signals obtained from the magnetic sensor elements, e.g. by summation or subtraction of two or more values.

The processing unit 1320 is preferably further adapted for determining a position, e.g. an angular position based on a ratio of these gradient signals, for example using a look-up table and interpolation, or by making use of goniometric functions (e.g. an arctangent function) or in any other suitable way. In case of a linear position sensor system, the processing unit 1320 may be further adapted for converting this angular position value into a linear position value.

The position value may be output by the controller as a first output signal "POS".

According to an underlying principle of the present invention, the controller also calculates and optionally also outputs a second signal "signal2", indicative of a fault or of the integrity of the system, or a value derived therefrom, for example after comparing the second signal with one or more predefined threshold values.

In an embodiment, the controller 1320 is configured for testing whether the second signal lies in a first predefined range, and if the outcome of this test is TRUE, the controller outputs an integrity signal "INT" having a first level (e.g. logical '1') corresponding to a "good" situation, and if the outcome of the test is FALSE, the controller outputs an integrity signal having a second level (e.g. a logical '0') corresponding to a "bad" situation, or vice versa. The output signals may be provided as digital signals, or as analog signals, or combinations hereof.

While not explicitly shown, the sensor device 1320 typically further comprises biasing circuitry, readout circuitry, one or more amplifiers, analog-to-digital convertors (ADC), etc. Such circuits are well known in the art, but are not the main focus of the present invention.

While the present invention is mainly described with horizontal Hall elements and/or vertical Hall elements, the present invention is not limited to this type of magnetic sensitive elements, and other types of magnetic sensor elements may also be used, for example circular Hall elements, or magneto-resistive elements, e.g. XMR or GMR elements.

FIG. 14 (*a*) and FIG. 14(*b*) show another embodiment of a sensor system 1400 comprising a two-pole magnet 1402 and a sensor device 1401 comprising three horizontal Hall elements H1, H2, H3 located on a virtual circle and angularly spaced apart by multiples of 120°. The magnet 1402 may be an axially or a diametrically magnetized ring or disk magnet. The center of the virtual circle is preferably located on the rotation axis of the magnet. Each of the horizontal Hall elements H1, H2, H3 measures a magnetic field component Bz oriented in the Z-direction, perpendicular to the semiconductor substrate. The values provided by the Hall elements H1, H2, H3 are Vh1, Vh2, and Vh3 respectively.

FIG. 14(*a*) is a schematic representation of the sensor device 1401.

FIG. 14(*b*) is a perspective view of the sensor system 1400.

FIG. 14(*c*) shows simulation results of a sum of squares of differences between pairs of two magnetic field components, e.g. in accordance with the formula:

$$\text{Signal2}=(Vh1-Vh2)^2+(Vh2-Vh3)^2+(Vh3-Vh1)^2$$

where signal2 is the signal indicative of a fault, Vh1, Vh2 and Vh3 are signals provided by the horizontal Hall elements (or derived therefrom, e.g. after amplification, digitization, etc.). Since the horizontal Hall elements H1, H2, H3 are oriented in the same (Z) direction, each of the difference signals (Vh1−Vh2), (Vh2−Vh3), and (Vh3−Vh1) is substantially insensitive to an external disturbance field, and hence also the sum of the squares of these difference signals is highly insensitive to an external disturbance field.

In the example shown, the sum of squares is constant over the full 360° measurement range. In practice, there may be a small variation on the signal (e.g. due to differences in magnetic sensitivity of the sensor elements). By calculating the sum and by comparing the sum with a first threshold smaller than said constant, and/or by comparing the sum with a second threshold larger than said constant, and by testing whether the sum is a value smaller than the lower threshold, and/or larger than the upper threshold, and/or a value between these two thresholds, it is possible to detect certain faults. In a practical implementation, an average value or median value may be determined during design and may be hardcoded, or an average value or median value may be determined during a calibration test and stored in a non-volatile memory of the sensor device, which may be retrieved during actual use.

The first threshold may be a value in the range from 75% to 99% of the above-mentioned average value, e.g. equal to about 75%, or equal to about 80%, or equal to about 85%, or equal to about 90%, or equal to about 95%, or equal to about 96%, or equal to about 97%, or equal to about 98%. The second threshold may be a value in the range from 101% to 125% of the above-mentioned average value, e.g. equal to about 102%, or equal to about 103%, or equal to about 104%, or equal to about 105%, or equal to about 110%, or equal to about 115%, or equal to about 120%, or equal to about 125%.

As a numerical example, if the individual signals would have an amplitude of 1.0, the difference signals would have an amplitude of about 1.73, and the average value would be equal to about 4.5. If the first threshold would be set at 85% of 4.5 (approximately 3.83), and the second threshold would be set at 115% of 4.5 (approximately 5.18), the second signal will indicate that the "system integrity is OK" if the calculated signal is a value in the range from 3.83 to 5.18 and will indicate that "a fault has occurred" if the calculated sum is a value outside this range.

FIG. 14(*d*) shows simulation results of another second signal Signal2' indicative of a fault, which is a variant of the formula of FIG. 14(*c*), wherein the second signal Signal2' is calculated as a sum of absolute values of differences between pairs of two magnetic field components, e.g. in accordance with the formula:

$$\text{Signal2'}=\text{abs}(Vh1-Vh2)^2+\text{abs}(Vh2-Vh3)^2+\text{abs}(Vh3-Vh1)^2$$

where signal2 is the signal indicative of a fault, Vh1, Vh2 and Vh3 are signals provided by the horizontal Hall elements H1 to H3 (or derived therefrom, e.g. after amplification, digitization, etc.). Since the horizontal Hall elements are oriented in the same (Z) direction, each of the difference signals (Vh1-Vh2), (Vh2-Vh3), and (Vh3-Vh1) is substantially insensitive to an external disturbance field, and hence also the sum of the absolute values of these differences is highly insensitive to an external disturbance field.

As a numerical example, if the original signals Vh1, Vh2, Vh3 have an amplitude of 1.0, the difference signals will have an amplitude of about 1.73, and the sum of the absolute values of these differences will be values in the range from about 3.00 to about 3.46. Thus, the average value is equal to about 3.23, and "valid" sums of absolute values of differences are values in the range from about 3.00 to about 3.46, which is about 3.23+/− about 7%.

It came as a big surprise that the sum of absolute values of the differences has such as small "ripple" (only about +/−7%), especially in view of the simple arithmetic: taking an absolute value is a very simple operation (only requires omitting the sign), in contrast to for example calculating a square or a polynomial, which typically requires a hardware multiplier, and typically requires more processing time.

In practice, taking into account typical tolerances (e.g. mechanical mounting tolerances), a slightly larger tolerance margin may be chosen, for example ±10%, or ±12%, or ±14%, or ±16%, or ±18%, or ±20%. Of course, the larger this tolerance range, the less sensitive the fault detection.

FIG. 15 (*a*) and FIG. 15(*b*) show another embodiment of a sensor system 1500 comprising a two-pole magnet and a sensor device 1501 comprising three horizontal Hall elements H1, H2, H3 located on a circle and angularly spaced apart by multiples of 120°, and a fourth horizontal Hall element Hc located in the center of the circle. The magnet may be an axially or a diametrically magnetized ring or disk magnet. The center of the virtual circle is preferably located on the rotation axis of the magnet. Each of the horizontal Hall elements H1, H2, H3, Hc measures a magnetic field component Bz oriented in the Z-direction, perpendicular to the semiconductor substrate. The values provided by the Hall elements H1, H2, H3, Hc are Vh1, Vh2, Vh3, Vhc respectively.

FIG. 15(*a*) is a schematic representation of the sensor device 1501.

FIG. 15(*b*) is a perspective view of the sensor system 1500.

FIG. 15(*c*) shows simulation results of a sum of squares of differences between each of the Hall elements H1, H2, H3 on the circle and the central Hall element Hc, e.g. in accordance with the formula:

$$\text{Signal2} = (Vh1 - Vhc)^2 + (Vh2 - Vhc)^2 + (Vh3 - Vhc)^2$$

where Signal2' is the signal indicative of a fault, Vh1, Vh2, Vh3 and Vhc are signals provided by the horizontal Hall elements H1, H2, H3, Hc (or derived therefrom, e.g. after amplification, digitization, etc.). Since the horizontal Hall elements are oriented in the same (Z) direction, each of the difference signals (Vh1−Vhc), (Vh2−Vhc), and (Vh3−Vhc) is substantially insensitive to an external disturbance field, and hence also the sum of the squares of these difference signals is highly insensitive to an external disturbance field.

In the example shown, the sum is constant over the full 360° measurement range. In practice, there may be a small variation on the signal (e.g. due to differences of magnetic sensitivity of the sensor elements). By calculating the sum and by comparing the sum with a first threshold smaller than said constant, and/or by comparing the sum with a second threshold larger than said constant, and by testing whether the sum is a value between these two thresholds, it is possible to detect certain faults. In a practical implementation, an average value or median value may be determined during design and may be hardcoded, or an average value or median value may be determined during a calibration test and stored in a non-volatile memory of the sensor device, which may be retrieved during actual use.

The first threshold may be a value in the range from 75% to 99% of the above-mentioned average value, e.g. equal to about 75%, or equal to about 80%, or equal to about 85%, or equal to about 90%, or equal to about 95%, or equal to about 96%, or equal to about 97%, or equal to about 98%. The second threshold may be a value in the range from 101% to 125% of the above-mentioned average value, e.g. equal to about 102%, or equal to about 103%, or equal to about 104%, or equal to about 105%, or equal to about 110%, or equal to about 115%, or equal to about 120%, or equal to about 125%.

As a numerical example, if the individual signals Vh1, Vh2, Vh3 would have an amplitude of 1.0, the difference signals would also have an amplitude of about 1.0, and the average value would be equal to about 1.5. If the first threshold would be set at 85% of 1.5 (approximately 1.28), and if the second threshold would be set at 115% of 1.5 (approximately 1.73), the second signal will indicate that the no fault is detected (thus the system integrity is good) if the calculated signal is a value in the range from 1.28 to 1.73 and will indicate that "a fault is detected" if the calculated sum is a value outside this range.

FIG. 15(*d*) shows simulation results of another second signal Signal2' indicative of a fault, which is a variant of the formula of FIG. 15(*c*), wherein the second signal Signal2' is calculated as a sum of absolute values of differences between each of the Hall elements H1, H2, H3 on the circle and the central element Hc, e.g. in accordance with the formula:

$$\text{Signal2}' = \text{abs}(Vh1 - Vhc)^2 + \text{abs}(Vh2 - Vhc)^2 + \text{abs}(Vh3 - Vhc)^2$$

where Signal2' is the signal indicative of a fault, Vh1, Vh2 and Vh3 are signals provided by the horizontal Hall elements H1, H2, H3 located on the circle (or derived therefrom, e.g. after amplification, digitization, etc.), and Vhc is the signal provided by the central Hall element Hc (or derived therefrom). Since the horizontal Hall elements are oriented in the same (Z) direction, each of the difference signals (Vh1−Vhc), (Vh2−Vhc), and (Vh3−Vhc) is substantially insensitive to an external disturbance field, and hence also the sum of the absolute values of these differences is highly insensitive to an external disturbance field.

As a numerical example, if the original signals Vh1, Vh2, Vh3 have an amplitude of 1.0, the difference signals will also have an amplitude of about 1.0, and the sum of the absolute values of these differences will be values in the range from about 1.73 to about 2.00. Thus, the average value is equal to about 1.87, and "valid" sums of absolute values of differences are values in the range from about 1.73 to about 2.00, which is about 1.87+/− about 7%.

It came as a big surprise that the sum of absolute values of the differences has such as small "ripple" (only about +/−7%), especially in view of the simple arithmetic: taking an absolute value is a very simple operation (only requires omitting the sign), in contrast to for example calculating a square or a polynomial, which typically requires a hardware multiplier, and typically requires more processing time.

In practice, taking into account typical tolerances (e.g. mechanical mounting tolerances), a slightly larger tolerance margin may be chosen, for example ±10%, or ±12%, or ±14%, or ±16%, or ±18%, or ±20%. Of course, the larger this tolerance range, the less sensitive the fault detection.

FIG. 16(*a*) and FIG. 16(*b*) show another embodiment of a sensor system 1600 comprising a two-pole magnet and a sensor device 1601 comprising three horizontal Hall elements H1, H2, H3 located on a circle and angularly spaced apart by multiples of 120°. The sensor device 1601 is configured to determine (e.g. in hardware and/or in software) an average signal Vavg in accordance with the following formula:

$$Vavg = (Vh1 + Vh2 + Vh3)/3,$$

where Vh1, Vh2, Vh3 are the signals provided by the horizontal Hall elements H1, H2, H3, and Vavg is the average of these three signals.

FIG. 16(*c*) shows simulation results of a sum of squares of differences between each magnetic field component and said average signal. This simulation provides the same result as shown in FIG. 15(*c*), and all that is mentioned above is also applicable here.

FIG. 16(*d*) shows simulation results of a sum of absolute values of differences between each magnetic field component and said average signal. This simulation provides the same result as shown in FIG. 15(*d*), and all that is mentioned above is also applicable here.

While the embodiments of FIG. 14(a)-(d), FIG. 15(a)-(d) and FIG. 16(a)-(d) are shown for a sensor system comprising a two-pole magnet and a sensor device comprising three horizontal Hall elements arranged on a circle, and optionally one central Hall element, the same principles also apply to a sensor system (not shown) comprising a four-pole magnet (e.g. a four-pole ring or disk magnet) and a sensor device (not shown) comprising six horizontal Hall elements arranged on a circle, angularly spaced apart by multiples of 60°, and optionally a central element Hc. The second signal may be calculated as:

$$\text{Signal2}=(Vh1-Vh2)^2+(Vh2-Vh3)^2+(Vh3-Vh4)^2+(Vh4-Vh5)^2+(Vh5-Vh6)^2+(Vh6-Vh1)^2,$$

where a sum of squares of differences is calculated between signals obtained from adjacent Hall elements. It can be shown that this sum of signals is substantially constant. The second signal may also be calculated as:

$$\text{Signal2}'=\text{abs}(Vh1-Vh2)+\text{abs}(Vh2-Vh3)+\text{abs}(Vh3-Vh4)+\text{abs}(Vh4-Vh5)+\text{abs}(Vh5-Vh6)+\text{abs}(Vh6-Vh1),$$

where a sum of absolute values of differences is calculated between signals obtained from adjacent Hall elements. It can be shown that this sum of signals has a relatively small ripple.

While a second signal in the form of a sum of absolute values is explicitly described above only for the systems shown in FIG. 4(c), FIG. 14(b), FIG. 15(b) and FIG. 16(b), it shall be clear to the skilled reader having the benefit of the present disclosure, that also in the other systems described above, a second signal in the form of a sum of squares of gradients or differences can be used, or in the form of a sum of absolute values of gradients or differences can be used, or in the form of another function which is substantially constant over the measurement range, such as for example a polynomial function of a degree of at least two, for example a polynomial comprising only second order and fourth order terms, or a polynomial comprising only even order terms, but the present invention is not limited hereto.

The invention claimed is:

1. A position sensor device, comprising:
   at least two magnetic sensors spaced apart in an X-direction, each of the at least two magnetic sensors configured to measure at least two orthogonal magnetic field components; and
   a processing circuit configured for:
   calculating two pairwise differences,
   calculating and outputting a first signal indicative of a position of the device relative to a magnetic source, based on a ratio of said two pairwise differences,
   calculating and outputting a second signal of a fault, the second signal based on a sum of squares of the two pairwise differences or a sum of absolute values of the two pairwise differences.

2. The position sensor device according to claim 1, the position sensor device further comprising a substrate, wherein each of the at least two orthogonal magnetic field components are oriented parallel to the substrate.

3. The position sensor device according to claim 1, the position sensor device further comprising a substrate, wherein a first of the at least two orthogonal magnetic field components is oriented parallel to the substrate and a second of the at least two orthogonal magnetic field components is oriented perpendicular to the substrate.

4. The position sensor device according to claim 1, wherein the second signal is based on a comparison of the sum of squares or the sum of absolute values with one or more threshold values.

5. The position sensor device according to claim 1, wherein the position comprises an angular position.

6. The position sensor device according to claim 1, wherein the position comprises a linear position.

7. The position sensor device according to claim 1,
   wherein each of the at least two magnetic sensors comprises a horizontal hall element and a vertical hall element; or
   wherein each of the at least two magnetic sensors comprises two vertical Hall elements with their axes of maximum sensitivity oriented perpendicular to each other.

8. The position sensor device according to claim 1, wherein each of the at least two magnetic sensors comprises an integrated magnetic concentrator IMC and two horizontal hall elements arranged near a periphery of the integrated magnetic concentrator.

9. A position sensor system, comprising:
   the position sensor device according to claim 1; and
   the magnetic source;
   wherein the magnetic source comprises a magnet having only two poles or having at least two poles.

10. A position sensor device, comprising: three magnetic sensors located on a virtual circle and spaced apart by multiples of 120°, each of the three magnetic sensors configured to measure a magnetic field component oriented perpendicular to a substrate of the device; and
    a processing circuit configured for:
    calculating an average of the measured magnetic field components,
    calculating three difference signals, each difference signal comprising a difference between one of the measured magnetic field components and the average,
    calculating a first signal of an angular position of the device relative to a magnetic source based on the difference signals,
    calculating and outputting a second signal of an integrity signal, a fault signal, or a magnet signal of a presence or absence of a magnet, and
    wherein the second signal is based on a sum of squares of the difference signals or a sum of absolute values of the difference signals.

11. The position sensor device according to claim 10, wherein each of the three magnetic sensors comprises a horizontal hall element.

12. The position sensor device according to claim 10, wherein the second signal is based on a comparison of the sum of squares of the difference signals or the sum of absolute values of the difference signals with one or more threshold values.

13. The position sensor device according to claim 10, wherein the substrate comprises a semiconductor substrate.

14. A position sensor system, comprising:
    the position sensor device according to claim 10; and
    the magnetic source;
    wherein the magnetic source comprises a magnet having only two poles or having at least two poles.

15. A position sensor device, comprising:
    a substrate comprising at least four pairs of sensor elements located on a virtual circle, each pair configured for measuring magnetic field components oriented in different directions parallel to the substrate; and a processing circuit configured for:
  determining at least four magnetic field gradients along at least four different directions parallel to the substrate and angularly spaced by 45°, based on said measured magnetic field components,
  calculating a first signal of a position of the position sensor device relative to a magnetic source,
  calculating and outputting a second signal of an integrity signal, a fault signal, or a magnet signal of a presence or absence of a magnet, the second signal based on the following formula:

signal $2=(dBx/dx-dBy/dy)^2+(dBu/du-dBv/dv)^2$ or a value derived therefrom,
  wherein Bx is a magnetic field component oriented in a first direction X parallel to the substrate, By is a magnetic field component oriented in a second direction Y parallel to the substrate and perpendicular to the first direction X, Bu is a magnetic field component oriented in a third direction U parallel to the substrate and forming an angle of 45° with the first direction X, and Bv is a magnetic field component oriented in a fourth direction V parallel to the substrate and perpendicular to the third direction U.

16. The position sensor device according to claim 15, wherein the sensor elements are provided in a single chip.

17. The position sensor device according to claim 15,
  wherein the position sensor device comprises at least one integrated magnetic concentrator; and
  wherein each of the sensor elements comprises a horizontal hall element arranged near a periphery of said at least one integrated magnetic concentrator.

18. A position sensor system, comprising:
  the position sensor device according to claim 15; and
  the magnetic source;
  wherein the magnetic source comprises a magnet having only four poles or having at least four poles.

19. The position sensor system according to claim 18, wherein the magnet is rotatable about a rotation axis and the position sensor device is located on said rotation axis.

20. The position sensor system according to claim 19, wherein the substrate comprises a semiconductor substrate oriented orthogonal to the rotation axis.

* * * * *